(12) United States Patent
Neoh et al.

(10) Patent No.: US 7,949,699 B1
(45) Date of Patent: May 24, 2011

(54) IMPLEMENTATION OF DECIMATION FILTER IN INTEGRATED CIRCUIT DEVICE USING RAM-BASED DATA STORAGE

(75) Inventors: Hong Shan Neoh, Princeton, NJ (US); Benjamin Esposito, Oviedo, FL (US)

(73) Assignee: Altera Corporation, San Jose, CA (US)

( * ) Notice: Subject to any disclaimer, the term of this patent is extended or adjusted under 35 U.S.C. 154(b) by 936 days.

(21) Appl. No.: 11/848,020

(22) Filed: Aug. 30, 2007

(51) Int. Cl.
*G06F 17/10* (2006.01)

(52) U.S. Cl. ....................................... 708/313

(58) Field of Classification Search ........................ None
See application file for complete search history.

(56) References Cited

U.S. PATENT DOCUMENTS

| | | |
|---|---|---|
| 3,473,160 A | 10/1969 | Wahlstrom |
| 4,156,927 A | 5/1979 | McElroy et al. |
| 4,179,746 A | 12/1979 | Tubbs |
| 4,212,076 A | 7/1980 | Conners |
| 4,215,406 A | 7/1980 | Gomola et al. |
| 4,215,407 A | 7/1980 | Gomola et al. |
| 4,422,155 A | 12/1983 | Amir et al. |
| 4,484,259 A | 11/1984 | Palmer et al. |
| 4,521,907 A | 6/1985 | Amir et al. |
| 4,575,812 A | 3/1986 | Kloker et al. |
| 4,597,053 A | 6/1986 | Chamberlin |
| 4,623,961 A | 11/1986 | Mackiewicz |
| 4,682,302 A | 7/1987 | Williams |
| 4,718,057 A | 1/1988 | Venkitakrishnan et al. |
| 4,727,508 A | 2/1988 | Williams |
| 4,791,590 A | 12/1988 | Ku et al. |
| 4,799,004 A | 1/1989 | Mori |
| 4,823,295 A | 4/1989 | Mader |
| 4,839,847 A | 6/1989 | Laprade |
| 4,871,930 A | 10/1989 | Wong et al. |
| 4,912,345 A | 3/1990 | Steele et al. |
| 4,918,637 A | 4/1990 | Morton |
| 4,967,160 A | 10/1990 | Quievy et al. |

(Continued)

FOREIGN PATENT DOCUMENTS

EP 0 158 430 10/1985

(Continued)

OTHER PUBLICATIONS

Altera Corporation, "FIR Compiler: MegaCore® Function User Guide," version 3.3.0, rev. 1, pp. 3 11 through 3 15 (Oct. 2005).

(Continued)

*Primary Examiner* — David H Malzahn
(74) *Attorney, Agent, or Firm* — Ropes & Gray LLP; Jeffrey H. Ingerman

(57) ABSTRACT

A programmable integrated circuit device such as a programmable logic device can be configured as a finite impulse response (FIR) filter capable of operating in decimation mode. The device includes at least one user-configurable random access memory block, and that user-configurable random access memory is configured as coefficient memories and data sample memories. The memories are large enough to hold up to all of the coefficients of the filter and a plurality of data samples at one time. Because the data samples and coefficients need not be shifted through the filter at the programmable logic device clock rate, overclocking of the filter is not necessary. The filter can run at a clock rate which is the same as the input data rate, while taking advantage of the available random access memory to mimic a shift register.

19 Claims, 15 Drawing Sheets

U.S. PATENT DOCUMENTS

| | | |
|---|---|---|
| 4,982,354 A | 1/1991 | Takeuchi et al. |
| 4,991,010 A | 2/1991 | Hailey et al. |
| 4,994,997 A | 2/1991 | Martin et al. |
| 5,073,863 A | 12/1991 | Zhang |
| 5,081,604 A | 1/1992 | Tanaka |
| 5,122,685 A | 6/1992 | Chan et al. |
| 5,128,559 A | 7/1992 | Steele |
| 5,175,702 A | 12/1992 | Beraud et al. |
| 5,208,491 A | 5/1993 | Ebeling et al. |
| RE34,363 E | 8/1993 | Freeman |
| 5,267,187 A | 11/1993 | Hsieh et al. |
| 5,296,759 A | 3/1994 | Sutherland et al. |
| 5,338,983 A | 8/1994 | Agarwala |
| 5,339,263 A | 8/1994 | White |
| 5,349,250 A | 9/1994 | New |
| 5,357,152 A | 10/1994 | Jennings, III et al. |
| 5,371,422 A | 12/1994 | Patel et al. |
| 5,381,357 A | 1/1995 | Wedgwood et al. |
| 5,404,324 A | 4/1995 | Colon-Bonet |
| 5,424,589 A | 6/1995 | Dobbelaere et al. |
| 5,446,651 A | 8/1995 | Moyse et al. |
| 5,451,948 A | 9/1995 | Jekel |
| 5,452,231 A | 9/1995 | Butts et al. |
| 5,452,375 A | 9/1995 | Rousseau et al. |
| 5,457,644 A | 10/1995 | McCollum |
| 5,465,226 A | 11/1995 | Goto |
| 5,465,375 A | 11/1995 | Thepaut et al. |
| 5,483,178 A | 1/1996 | Costello et al. |
| 5,497,498 A | 3/1996 | Taylor |
| 5,500,812 A | 3/1996 | Saishi et al. |
| 5,500,828 A | 3/1996 | Doddington et al. |
| 5,523,963 A | 6/1996 | Hsieh et al. |
| 5,528,550 A | 6/1996 | Pawate et al. |
| 5,537,601 A | 7/1996 | Kimura et al. |
| 5,541,864 A | 7/1996 | Van Bavel et al. |
| 5,546,018 A | 8/1996 | New et al. |
| 5,550,993 A | 8/1996 | Ehlig et al. |
| 5,559,450 A | 9/1996 | Ngai et al. |
| 5,563,526 A | 10/1996 | Hastings et al. |
| 5,563,819 A | 10/1996 | Nelson |
| 5,570,039 A | 10/1996 | Oswald et al. |
| 5,570,040 A | 10/1996 | Lytle et al. |
| 5,572,148 A | 11/1996 | Lytle et al. |
| 5,581,501 A | 12/1996 | Sansbury et al. |
| 5,590,350 A | 12/1996 | Guttag et al. |
| 5,594,366 A | 1/1997 | Khong et al. |
| 5,594,912 A | 1/1997 | Brueckmann et al. |
| 5,596,763 A | 1/1997 | Guttag et al. |
| 5,606,266 A | 2/1997 | Pedersen |
| 5,617,058 A | 4/1997 | Adrian et al. |
| 5,633,601 A | 5/1997 | Nagaraj |
| 5,636,150 A | 6/1997 | Okamoto |
| 5,636,368 A | 6/1997 | Harrison et al. |
| 5,640,578 A | 6/1997 | Balmer et al. |
| 5,644,519 A | 7/1997 | Yatim et al. |
| 5,644,522 A | 7/1997 | Moyse et al. |
| 5,646,545 A | 7/1997 | Trimberger et al. |
| 5,646,875 A | 7/1997 | Taborn et al. |
| 5,648,732 A | 7/1997 | Duncan |
| 5,652,903 A | 7/1997 | Weng et al. |
| 5,655,069 A | 8/1997 | Ogawara et al. |
| 5,664,192 A | 9/1997 | Lloyd et al. |
| 5,689,195 A | 11/1997 | Cliff et al. |
| 5,696,708 A | 12/1997 | Leung |
| 5,729,495 A | 3/1998 | Madurawe |
| 5,740,404 A | 4/1998 | Baji |
| 5,744,980 A | 4/1998 | McGowan et al. |
| 5,744,991 A | 4/1998 | Jefferson et al. |
| 5,754,459 A | 5/1998 | Telikepalli |
| 5,761,483 A | 6/1998 | Trimberger |
| 5,764,555 A | 6/1998 | McPherson et al. |
| 5,768,613 A | 6/1998 | Asghar |
| 5,777,912 A | 7/1998 | Leung et al. |
| 5,784,636 A | 7/1998 | Rupp |
| 5,790,446 A | 8/1998 | Yu et al. |
| 5,794,067 A | 8/1998 | Kadowaki |
| 5,801,546 A | 9/1998 | Pierce et al. |
| 5,805,477 A | 9/1998 | Perner |
| 5,805,913 A | 9/1998 | Guttag et al. |
| 5,808,926 A | 9/1998 | Gorshtein et al. |
| 5,812,479 A | 9/1998 | Cliff et al. |
| 5,812,562 A | 9/1998 | Baeg |
| 5,815,422 A | 9/1998 | Dockser |
| 5,821,776 A | 10/1998 | McGowan |
| 5,825,202 A | 10/1998 | Tavana et al. |
| 5,838,165 A | 11/1998 | Chatter |
| 5,841,684 A | 11/1998 | Dockser |
| 5,847,579 A | 12/1998 | Trimberger |
| 5,847,981 A | 12/1998 | Kelley et al. |
| 5,859,878 A | 1/1999 | Phillips et al. |
| 5,869,979 A | 2/1999 | Bocchino |
| 5,872,380 A | 2/1999 | Rostoker et al. |
| 5,874,834 A | 2/1999 | New |
| 5,878,250 A | 3/1999 | LeBlanc |
| 5,880,981 A | 3/1999 | Kojima et al. |
| 5,892,962 A | 4/1999 | Cloutier |
| 5,894,228 A | 4/1999 | Reddy et al. |
| 5,898,602 A | 4/1999 | Rothman et al. |
| 5,931,898 A | 8/1999 | Khoury |
| 5,942,914 A | 8/1999 | Reddy et al. |
| 5,944,774 A | 8/1999 | Dent |
| 5,949,710 A | 9/1999 | Pass et al. |
| 5,951,673 A | 9/1999 | Miyata |
| 5,956,265 A | 9/1999 | Lewis |
| 5,959,871 A | 9/1999 | Pierzchala et al. |
| 5,960,193 A | 9/1999 | Guttag et al. |
| 5,961,635 A | 10/1999 | Guttag et al. |
| 5,963,048 A | 10/1999 | Harrison et al. |
| 5,963,050 A | 10/1999 | Young et al. |
| 5,968,196 A | 10/1999 | Ramamurthy et al. |
| 5,970,254 A | 10/1999 | Cooke et al. |
| 5,978,260 A | 11/1999 | Trimberger et al. |
| 5,982,195 A | 11/1999 | Cliff et al. |
| 5,986,465 A | 11/1999 | Mendel |
| 5,991,788 A | 11/1999 | Mintzer |
| 5,991,898 A | 11/1999 | Rajski et al. |
| 5,995,748 A | 11/1999 | Guttag et al. |
| 5,999,015 A | 12/1999 | Cliff et al. |
| 5,999,990 A | 12/1999 | Sharrit et al. |
| 6,005,806 A | 12/1999 | Madurawe et al. |
| 6,006,321 A | 12/1999 | Abbott |
| 6,009,451 A | 12/1999 | Burns |
| 6,018,755 A | 1/2000 | Gonikberg et al. |
| 6,020,759 A | 2/2000 | Heile |
| 6,021,423 A | 2/2000 | Nag et al. |
| 6,029,187 A | 2/2000 | Verbauwhede |
| 6,031,763 A | 2/2000 | Sansbury |
| 6,041,339 A * | 3/2000 | Yu et al. .................. 708/313 |
| 6,041,340 A | 3/2000 | Mintzer |
| 6,052,327 A | 4/2000 | Reddy et al. |
| 6,052,755 A | 4/2000 | Terrill et al. |
| 6,055,555 A | 4/2000 | Boswell et al. |
| 6,064,614 A | 5/2000 | Khoury |
| 6,065,131 A | 5/2000 | Andrews et al. |
| 6,066,960 A | 5/2000 | Pedersen |
| 6,069,487 A | 5/2000 | Lane et al. |
| 6,072,994 A | 6/2000 | Phillips et al. |
| 6,073,154 A | 6/2000 | Dick |
| 6,075,381 A | 6/2000 | LaBerge |
| 6,084,429 A | 7/2000 | Trimberger |
| 6,085,317 A | 7/2000 | Smith |
| 6,091,261 A | 7/2000 | DeLange |
| 6,091,765 A | 7/2000 | Pietzold, III et al. |
| 6,094,726 A | 7/2000 | Gonion et al. |
| 6,097,988 A | 8/2000 | Tobias |
| 6,098,163 A | 8/2000 | Guttag et al. |
| 6,107,820 A | 8/2000 | Jefferson et al. |
| 6,107,821 A | 8/2000 | Kelem et al. |
| 6,107,824 A | 8/2000 | Reddy et al. |
| 6,130,554 A | 10/2000 | Kolze et al. |
| 6,140,839 A | 10/2000 | Kaviani et al. |
| 6,144,980 A | 11/2000 | Oberman |
| 6,154,049 A | 11/2000 | New |
| 6,157,210 A | 12/2000 | Zaveri et al. |
| 6,163,788 A | 12/2000 | Chen et al. |
| 6,167,415 A | 12/2000 | Fischer et al. |
| 6,175,849 B1 | 1/2001 | Smith |

| | | |
|---|---|---|
| 6,215,326 B1 | 4/2001 | Jefferson et al. |
| 6,226,735 B1 | 5/2001 | Mirsky |
| 6,242,947 B1 | 6/2001 | Trimberger |
| 6,243,729 B1 | 6/2001 | Staszewski |
| 6,246,258 B1 | 6/2001 | Lesea |
| 6,279,021 B1 | 8/2001 | Takano et al. |
| 6,286,024 B1 | 9/2001 | Yano et al. |
| 6,314,442 B1 | 11/2001 | Suzuki |
| 6,314,551 B1 | 11/2001 | Borland |
| 6,321,246 B1 | 11/2001 | Page et al. |
| 6,323,680 B1 | 11/2001 | Pedersen et al. |
| 6,327,605 B2 | 12/2001 | Arakawa et al. |
| 6,351,142 B1 | 2/2002 | Abbott |
| 6,353,843 B1 | 3/2002 | Chehrazi et al. |
| 6,359,468 B1 | 3/2002 | Park et al. |
| 6,360,240 B1 | 3/2002 | Takano et al. |
| 6,362,650 B1 | 3/2002 | New et al. |
| 6,366,944 B1 | 4/2002 | Hossain et al. |
| 6,367,003 B1 | 4/2002 | Davis |
| 6,369,610 B1 | 4/2002 | Cheung et al. |
| 6,377,970 B1 | 4/2002 | Abdallah et al. |
| 6,407,576 B1 | 6/2002 | Ngai et al. |
| 6,407,694 B1 | 6/2002 | Cox et al. |
| 6,427,157 B1 * | 7/2002 | Webb .................... 708/313 |
| 6,434,587 B1 | 8/2002 | Liao et al. |
| 6,438,569 B1 | 8/2002 | Abbott |
| 6,438,570 B1 | 8/2002 | Miller |
| 6,446,107 B1 | 9/2002 | Knowles |
| 6,453,382 B1 | 9/2002 | Heile |
| 6,467,017 B1 | 10/2002 | Ngai et al. |
| 6,480,980 B2 | 11/2002 | Koe |
| 6,483,343 B1 | 11/2002 | Faith et al. |
| 6,487,575 B1 | 11/2002 | Oberman |
| 6,523,055 B1 | 2/2003 | Yu et al. |
| 6,531,888 B2 | 3/2003 | Abbott |
| 6,538,470 B1 | 3/2003 | Langhammer et al. |
| 6,542,000 B1 | 4/2003 | Black et al. |
| 6,556,044 B2 | 4/2003 | Langhammer et al. |
| 6,557,092 B1 | 4/2003 | Callen |
| 6,571,268 B1 | 5/2003 | Giacalone et al. |
| 6,573,749 B2 | 6/2003 | New et al. |
| 6,574,762 B1 | 6/2003 | Karimi et al. |
| 6,591,283 B1 | 7/2003 | Conway et al. |
| 6,591,357 B2 | 7/2003 | Mirsky |
| 6,600,495 B1 | 7/2003 | Boland et al. |
| 6,600,788 B1 | 7/2003 | Dick et al. |
| 6,628,140 B2 | 9/2003 | Langhammer et al. |
| 6,687,722 B1 | 2/2004 | Larsson et al. |
| 6,692,534 B1 | 2/2004 | Wang et al. |
| 6,700,581 B2 | 3/2004 | Baldwin et al. |
| 6,725,441 B1 | 4/2004 | Keller et al. |
| 6,728,901 B1 | 4/2004 | Rajski et al. |
| 6,731,133 B1 | 5/2004 | Feng et al. |
| 6,732,134 B1 | 5/2004 | Rosenberg |
| 6,744,278 B1 | 6/2004 | Liu et al. |
| 6,745,254 B2 | 6/2004 | Boggs et al. |
| 6,763,367 B2 | 7/2004 | Kwon et al. |
| 6,771,094 B1 | 8/2004 | Langhammer et al. |
| 6,774,669 B1 | 8/2004 | Liu et al. |
| 6,781,408 B1 | 8/2004 | Langhammer |
| 6,781,410 B2 | 8/2004 | Pani et al. |
| 6,788,104 B2 | 9/2004 | Singh et al. |
| 6,801,924 B1 | 10/2004 | Green et al. |
| 6,836,839 B2 | 12/2004 | Master et al. |
| 6,874,079 B2 | 3/2005 | Hogenauer |
| 6,889,238 B2 * | 5/2005 | Johnson .................... 708/313 |
| 6,904,471 B2 | 6/2005 | Boggs et al. |
| 6,924,663 B2 | 8/2005 | Masui et al. |
| 6,963,890 B2 | 11/2005 | Dutta et al. |
| 6,971,083 B1 | 11/2005 | Farrugia et al. |
| 6,978,287 B1 | 12/2005 | Langhammer |
| 7,020,673 B2 | 3/2006 | Ozawa |
| 7,093,204 B2 | 8/2006 | Oktem et al. |
| 7,107,305 B2 | 9/2006 | Deng et al. |
| 7,113,969 B1 | 9/2006 | Green et al. |
| 7,181,484 B2 | 2/2007 | Stribaek et al. |
| 7,313,585 B2 | 12/2007 | Winterrowd |
| 7,395,298 B2 | 7/2008 | Debes et al. |
| 7,409,417 B2 | 8/2008 | Lou |
| 7,415,542 B2 | 8/2008 | Hennedy et al. |
| 7,421,465 B1 | 9/2008 | Rarick et al. |
| 7,428,566 B2 | 9/2008 | Siu et al. |
| 7,430,578 B2 | 9/2008 | Debes et al. |
| 7,430,656 B2 | 9/2008 | Sperber et al. |
| 7,472,155 B2 | 12/2008 | Simkins et al. |
| 7,536,430 B2 | 5/2009 | Guevokian et al. |
| 7,590,676 B1 | 9/2009 | Langhammer |
| 7,646,430 B2 | 1/2010 | Brown Elliott et al. |
| 7,668,896 B2 | 2/2010 | Lutz et al. |
| 7,719,446 B2 * | 5/2010 | Rosenthal et al. ............ 341/61 |
| 7,814,137 B1 | 10/2010 | Mauer |
| 7,822,799 B1 | 10/2010 | Langhammer et al. |
| 7,836,117 B1 | 11/2010 | Langhammer et al. |
| 7,865,541 B1 | 1/2011 | Langhammer |
| 2001/0023425 A1 | 9/2001 | Oberman et al. |
| 2001/0029515 A1 | 10/2001 | Mirsky |
| 2002/0002573 A1 | 1/2002 | Landers et al. |
| 2002/0038324 A1 * | 3/2002 | Page et al. .................... 708/300 |
| 2002/0049798 A1 * | 4/2002 | Wang et al. .................... 708/319 |
| 2002/0078114 A1 * | 6/2002 | Wang et al. .................... 708/313 |
| 2002/0089348 A1 | 7/2002 | Langhammer |
| 2002/0116434 A1 | 8/2002 | Nancekievill |
| 2003/0088757 A1 | 5/2003 | Lindner et al. |
| 2004/0064770 A1 | 4/2004 | Xin |
| 2004/0083412 A1 | 4/2004 | Corbin et al. |
| 2004/0103133 A1 | 5/2004 | Gurney |
| 2004/0148321 A1 | 7/2004 | Guevorkian et al. |
| 2004/0172439 A1 | 9/2004 | Lin |
| 2004/0178818 A1 | 9/2004 | Crotty et al. |
| 2004/0193981 A1 | 9/2004 | Clark et al. |
| 2004/0267863 A1 | 12/2004 | Bhushan et al. |
| 2005/0038842 A1 | 2/2005 | Stoye |
| 2005/0144212 A1 | 6/2005 | Simkins et al. |
| 2005/0144215 A1 | 6/2005 | Simkins et al. |
| 2005/0144216 A1 | 6/2005 | Simkins et al. |
| 2005/0166038 A1 | 7/2005 | Wang et al. |
| 2005/0187997 A1 | 8/2005 | Zheng et al. |
| 2005/0187999 A1 | 8/2005 | Zheng et al. |
| 2006/0020655 A1 | 1/2006 | Lin |
| 2007/0185951 A1 | 8/2007 | Lee et al. |
| 2007/0185952 A1 | 8/2007 | Langhammer et al. |
| 2007/0241773 A1 | 10/2007 | Hutchings et al. |
| 2008/0133627 A1 | 6/2008 | Langhammer et al. |
| 2009/0187615 A1 | 7/2009 | Abe et al. |

FOREIGN PATENT DOCUMENTS

| | | |
|---|---|---|
| EP | 0 380 456 | 8/1990 |
| EP | 0 411 491 | 2/1991 |
| EP | 0 461 798 | 12/1991 |
| EP | 0 498 066 | 8/1992 |
| EP | 0 555 092 | 8/1993 |
| EP | 0 606 653 | 7/1994 |
| EP | 0 657 803 | 6/1995 |
| EP | 0 660 227 | 6/1995 |
| EP | 0 668 659 | 8/1995 |
| EP | 0 905 906 | 3/1999 |
| EP | 0 909 028 | 4/1999 |
| EP | 0 927 393 | 7/1999 |
| EP | 0 992 885 | 4/2000 |
| EP | 1 031 934 | 8/2000 |
| EP | 1 058 185 | 12/2000 |
| EP | 1 220 108 | 7/2002 |
| GB | 2 283 602 | 5/1995 |
| GB | 2 286 737 | 8/1995 |
| GB | 2 318 198 | 4/1998 |
| JP | 61-237133 | 10/1986 |
| JP | 7-135447 | 5/1995 |
| WO | WO95-27243 | 10/1995 |
| WO | WO96-28774 | 9/1996 |
| WO | WO97-08606 | 3/1997 |
| WO | WO98-12629 | 3/1998 |
| WO | WO98-32071 | 7/1998 |
| WO | WO98-38741 | 9/1998 |
| WO | WO99-22292 | 5/1999 |
| WO | WO99-31574 | 6/1999 |
| WO | WO99-56394 | 11/1999 |
| WO | WO00-51239 | 8/2000 |

| WO | WO00-52824 | 9/2000 |
| WO | WO01-13562 | 2/2001 |
| WO | WO2005-101190 | 10/2005 |

OTHER PUBLICATIONS

Altera Corporation, "Statix II Device Handbook, Chapter 6—DSP Blocks in Stratix II Devices," v1.1, Jul. 2004.

Altera Corporation, "Digital Signal Processing (DSP)," *Stratix Device Handbook*, vol. 2, Chapter 6 and Chapter 7, v1.1 (Sep. 2004).

Altera Corporation, "DSP Blocks in Stratix II and Stratix II GX Devices " *Stratix II Device Handbook*, vol. 2, Chapter 6, v4.0 (Oct. 2005).

Amos, D., "PLD architectures match DSP algorithms " *Electronic Product Design*, vol. 17, No. 7, Jul. 1996, pp. 30, 32.

Analog Devices, Inc., The Applications Engineering Staff of Analog Devices, DSP Division, *Digital Signal Processing Applications Using the ADSP-2100 Family* (edited by Amy Mar), 1990, pp. 141-192).

Andrejas, J., et al., "Reusable DSP functions in FPGAs " *Field-Programmable Logic and Applications, Roadmap to Reconfigurable Computing, 10th International Conference, FPL 2000, Proceedings* (*Lecture Notes in Computer Science* vol. 1896), Aug. 27-30, 2000, pp. 456-461.

Aoki, T., "Signed-weight arithmetic and its application to a field-programmable digital filter architecture," *IEICE Transactions on Electronics* , 1999 , vol. E82C, No. 9, Sep. 1999, pp. 1687-1698.

Ashour, M.A., et al., "An FPGA implementation guide for some different types of serial-parallel multiplier-structures," *Microelectronics Journal* , vol. 31, No. 3, 2000, pp. 161-168.

Berg, B.L., et al."Designing Power and Area Efficient Multistage FIR Decimators with Economical Low Order Filters," *ChipCenter Technical Note*, Dec. 2001.

Bursky, D., "Programmable Logic Challenges Traditional ASIC SoC Designs", *Electronic Design*, Apr. 15, 2002.

Chhabra, A. et al., Texas Instruments Inc., "A Block Floating Point Implementation on the TMS320C54x DSP", Application Report SPRA610, Dec. 1999, pp. 1-10.

Colet, p., "When DSPs and FPGAs meet: Optimizing image processing architectures," *Advanced Imaging*, vol. 12, No. 9, Sep. 1997, pp. 14, 16, 18.

Crookes, D., et al., "Design and implementation of a high level programming environment for FPGA-based image processing," *IEE Proceedings-Vision, Image and Signal Processing*, vol. 147, No. 4, Aug. 2000, pp. 377-384.

Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-286.

Dick, C., et al., "Configurable logic for digital communications: some signal processing perspectives," *IEEE Communications Magazine*, vol. 37, No. 8, Aug. 1999, pp. 107-111.

Do, T.-T., et al., "A flexible implementation of high-performance FIR filters on Xilinx FPGAs " *Field-Programmable Logic and Applications: From FPGAs to Computing Paradigm, 8th International Workshop, FPL '98, Proceedings*, Hartenstein, R.W., et al., eds., Aug. 31-Sep. 3, 1998, pp. 441-445.

Gaffar, A.A., et al., "Floating-Point Bitwidth Analysis via Automatic Differentiation," *IEEE Conference on Field Programmable Technology*, Hong Kong, Dec. 2002.

Guccione, S.A.,"Run-time Reconfiguration at Xilinx," *Parallel and distributed processing: 15 IPDPS 2000 workshops*, Rolim, J., ed., May 1-5, 2000, p. 873.

Hauck, S., "The Future of Reconfigurable Systems," *Keynote Address, 5th Canadian Conference on Field Programmable Devices*, Jun. 1998, http:—www.ee.washington.edu-people-faculty-hauck-publications-ReconfigFuture.PDF.

Heysters, P.M., et al., "Mapping of DSP algorithms on field programmable function arrays," *Field-Programmable Logic and Applications, Roadmap to Reconfigurable Computing, 10th International Conference, FPL 2000, Proceedings* (*Lecture Notes in Computer Science* vol. 1896), Aug. 27-30, 2000, pp. 400-411.

Huang, J., et al., "Simulated Performance of 1000BASE-T Receiver with Different Analog Front End Designs," *Proceedings of the 35th Asilomar Conference on Signals, Systems, and Computers*, Nov. 4-7, 2001.

Lattice Semiconductor Corp, *ORCA® FPGA Express™ Interface manual: ispLEVER® Version 3.0*, 2002.

Lucent Technologies, Microelectronics Group,"Implementing and Optimizing Multipliers in ORCA™ FPGAs,", Application Note. AP97-008FGPA, Feb. 1997.

"Implementing Multipliers in FLEX 10K EABs", *Altera*, Mar. 1996.

"Implementing Logic with the Embedded Array in FLEX 10K Devices", *Altera*, May 2001, ver. 2.1.

Jinghua Li, "Design a pocket multi-bit multiplier in FPGA," *1996 2nd International Conference on ASIC Proceedings* (*IEEE Cat. No. 96TH8140*), Oct. 21-24, 1996, pp. 275-279.

Jones, G., "Field-programmable digital signal conditioning," *Electronic Product Design*, vol. 21, No. 6, Jun. 2000, pp. C36-C38.

Kiefer, R., et al., "Performance comparison of software-FPGA hardware partitions for a DSP application," *14th Australian Microelectronics Conference, Microelectronics: Technology Today for the Future, MICRO '97 Proceedings*, Sep. 28-Oct. 1, 1997, pp. 88-93.

Kramberger, I., "DSP acceleration using a reconfigurable FPGA," *ISIE '99 Proceedings of the IEEE International Symposium on Industrial Electronics* (Cat. No. 99TH8465), vol. 3, Jul. 12-16, 1999, pp. 1522-1525.

Langhammer, M., "How to implement DSP in programmable logic," *Elettronica Oggi*, No. 266 , Dec. 1998, pp. 113-115.

Langhammer, M., "Implementinf a DSP in Programmanle Logic," *Online EE Times*, May 1998, http:—www.eetimes.com-editorial-1998-coverstory9805.html.

Lazaravich, B.V., "Function block oriented field programmable logic arrays," Motorola, Inc. Technical Developments vol. 18, Mar. 1993, pp. 10-11.

Lund, D., et al., "A new development system for reconfigurable digital signal processing," First International Conference on 3G Mobile Communication Technologies (Conf. Publ. No. 471), Mar. 27-29, 2000, pp. 306-310.

Miller, N.L., et al., "Reconfigurable integrated circuit for high performance computer arithmetic," *Proceedings of the 1998 IEE Colloquium on Evolvable Hardware Systems* (*Digest*), No. 233, 1998, pp. 2-1-2-4.

Mintzer, L., "Xilinx FPGA as an FFT processor," *Electronic Engineering*, vol. 69, No. 845, May 1997, pp. 81, 82, 84.

Faura et al., "A Novel Mixed Signal Programmable Device With On-Chip Microprocessor," Custom Integrated Circuits Conference, 1997. Proceedings of the IEEE 1997 Santa Clara, CA, USA, May 5, 1997, pp. 103-106.

Nozal, L., et al., "A new vision system: programmable logic devices and digital signal processor architecture (PLD+DSP)" *Proceedings IECON '91. 1991 International Conference on Industrial Electronics, Control and Instrumentation* (Cat. No. 91CH2976-9), vol. 3, Oct. 28-Nov. 1, 1991, pp. 2014-2018.

Papenfuss, J.R, et al., "Implementation of a real-time, frequency selective, RF channel simulator using a hybrid DSP-FPGA architecture," *RAWCON 2000: 2000 IEEE Radio and Wireless Conference* (Cat. No. 00EX404), Sep. 10-13, 2000, pp. 135-138.

Parhami, B., "Configurable arithmetic arrays with data-driven control," *34th Asilomar Conference on Signals, Systems and Computers*, vol. 1, 2000, pp. 89-93.

"The QuickDSP Design Guide", Quicklogic, Aug. 7, 2001, revision B.

"QuickDSP™ Family Data Sheet", *Quicklogic*, Aug. 7, 2001, revision B.

Rangasayee, K., "Complex PLDs let you produce efficient arithmetic designs," *EDN* (*European Edition*), vol. 41, No. 13, Jun. 20, 1996, pp. 109, 110, 112, 114, 116.

Rosado, A., et al., "A high-speed multiplier coprocessor unit based on FPGA," *Journal of Electrical Engineering*, vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications* (Cat. No. 99EX303), Jul. 26-28, 1999, pp. 147-150.

Texas Instruments Inc., "TMS320C54x DSP reference Set, vol. 1: CPU and Peripherals", Literature No. SPRU131F, Apr. 1999, pp. 2-1 through 2-16 and 4-1 through 4-29.

Tisserand, A., et al., "An on-line arithmetic based FPGA for low power custom computing," *Field Programmable Logic and Applications, 9th International Workshop, FPL'99, Proceedings (Lecture Notes in Computer Science* vol. 1673), Lysaght, P., et al., eds., Aug. 30-Sep. 1, 1999, pp. 264-273.

Tralka, C., "Symbiosis of DSP and PLD," *Elektronik*, vol. 49, No. 14, Jul. 11, 2000, pp. 84-96.

Underwood, K. "FPGAs vs. CPUs: Trends in Peak Floating-Point Performance," *Proceedings of the 2004 ACM-SIGDA 12th International Symposium on Field Programmable Gate Arrays*, pp. 171-180, Feb. 22-24, 2004.

Valls, J., et al., "A Study About FPGA-Based Digital Filters," *Signal Processing Systems, 1998*, SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx*, Apr. 2, 2001, module 2 of 4.

Walters, A.L., "A Scaleable FIR Filter Implementation Using 32-bit Floating-Point Complex Arithmetic on,a FPGA Based Custom Computing Platform," Allison L. Walters, Thesis Submitted to the Faculty of Virginia Polytechnic Institute and State University, Jan. 30, 1998.

Weisstein, E.W., "Karatsuba Multiplication," *MathWorld—A Wolfram Web resource* (Dec. 9, 2007), accessed Dec. 11, 2007 at http:—mathworld.worlfram.com-KaratsubaMultiplication.html.

Wenzel, L., "Field programmable gate arrays (FPGAs) to replace digital signal processor integrated circuits," *Elektronik*, vol. 49, No. 5, Mar. 7, 2000, pp. 78-86.

"Xilinx Unveils New FPGA Architecture to Enable High-Performance, 10 Million System Gate Designs", *Xilinx*, Jun. 22, 2000.

"Xilinx Announces DSP Algorithms, Tools and Features for Virtex-II Architecture", *Xilinx*, Nov. 21, 2000.

Xilinx Inc., "Virtex-II 1.5V Field-Programmable Gate Arrays", Advance Product Specification, DS031-2 (v1.9), Nov. 29, 2001, Module 2 of 4, pp. 1-39.

Xilinx Inc., "Using Embedded Multipliers", Virtex-II Platform FPGA Handbook, UG002 (v1.3), Dec. 3, 2001, pp. 251-257.

Xilinx, Inc., "A 1D Systolic FIR," copyright 1994-2002, downloaded from http:— www.iro.umontreal.ca-~aboulham-F6221-Xilinx%20A%201D%20systolic%20FIR.htm.

Xilinx, Inc., "The Future of FPGA's," White Paper, available Nov. 14, 2005 for download from http:—www.xilinx.com-prs_rls,5yrwhite.htm.

Xilinx Inc.," XtremeDSP Design Considerations User Guide," v 1.2, Feb. 4, 2005.

Xilinx Inc., "Complex Multiplier v2.0", DS291 Product Specification/Datasheet, Nov. 2004.

\* cited by examiner

| CLK # | C1 | C2 | C3 | C4 | C5 | C6 | C7 | C8 | C9 | C10 | C11 | C12 | |
|---|---|---|---|---|---|---|---|---|---|---|---|---|---|
| 1 | 1 | 2 | 3 | 4 | 5 | 6 | 7 | 8 | 9 | 10 | 11 | 12 | ✓ |
| 2 | 2 | 3 | 4 | 5 | 6 | 7 | 8 | 9 | 10 | 11 | 12 | 13 | ✗ |
| 3 | 3 | 4 | 5 | 6 | 7 | 8 | 9 | 10 | 11 | 12 | 13 | 14 | ✓ |
| 4 | 4 | 5 | 6 | 7 | 8 | 9 | 10 | 11 | 12 | 13 | 14 | 15 | ✗ |
| 5 | 5 | 6 | 7 | 8 | 9 | 10 | 11 | 12 | 13 | 14 | 15 | 16 | ✓ |
| 6 | 6 | 7 | 8 | 9 | 10 | 11 | 12 | 13 | 14 | 15 | 16 | 17 | ✗ |
| 7 | 7 | 8 | 9 | 10 | 11 | 12 | 13 | 14 | 15 | 16 | 17 | 18 | ✓ |
| 8 | 8 | 9 | 10 | 11 | 12 | 13 | 14 | 15 | 16 | 17 | 18 | 19 | ✗ |
| 9 | 9 | 10 | 11 | 12 | 13 | 14 | 15 | 16 | 17 | 18 | 19 | 20 | ✓ |
| 10 | 10 | 11 | 12 | 13 | 14 | 15 | 16 | 17 | 18 | 19 | 20 | 21 | ✗ |
| 11 | 11 | 12 | 13 | 14 | 15 | 16 | 17 | 18 | 19 | 20 | 21 | 22 | ✓ |
| 12 | 12 | 13 | 14 | 15 | 16 | 17 | 18 | 19 | 20 | 21 | 22 | 23 | ✗ |
| 13 | 13 | 14 | 15 | 16 | 17 | 18 | 19 | 20 | 21 | 22 | 23 | 24 | ✓ |
| 14 | 14 | 15 | 16 | 17 | 18 | 19 | 20 | 21 | 22 | 23 | 24 | 25 | ✗ |

COEFFICIENTS

✓ KEEP SAMPLE   ✗ DISCARD SAMPLE

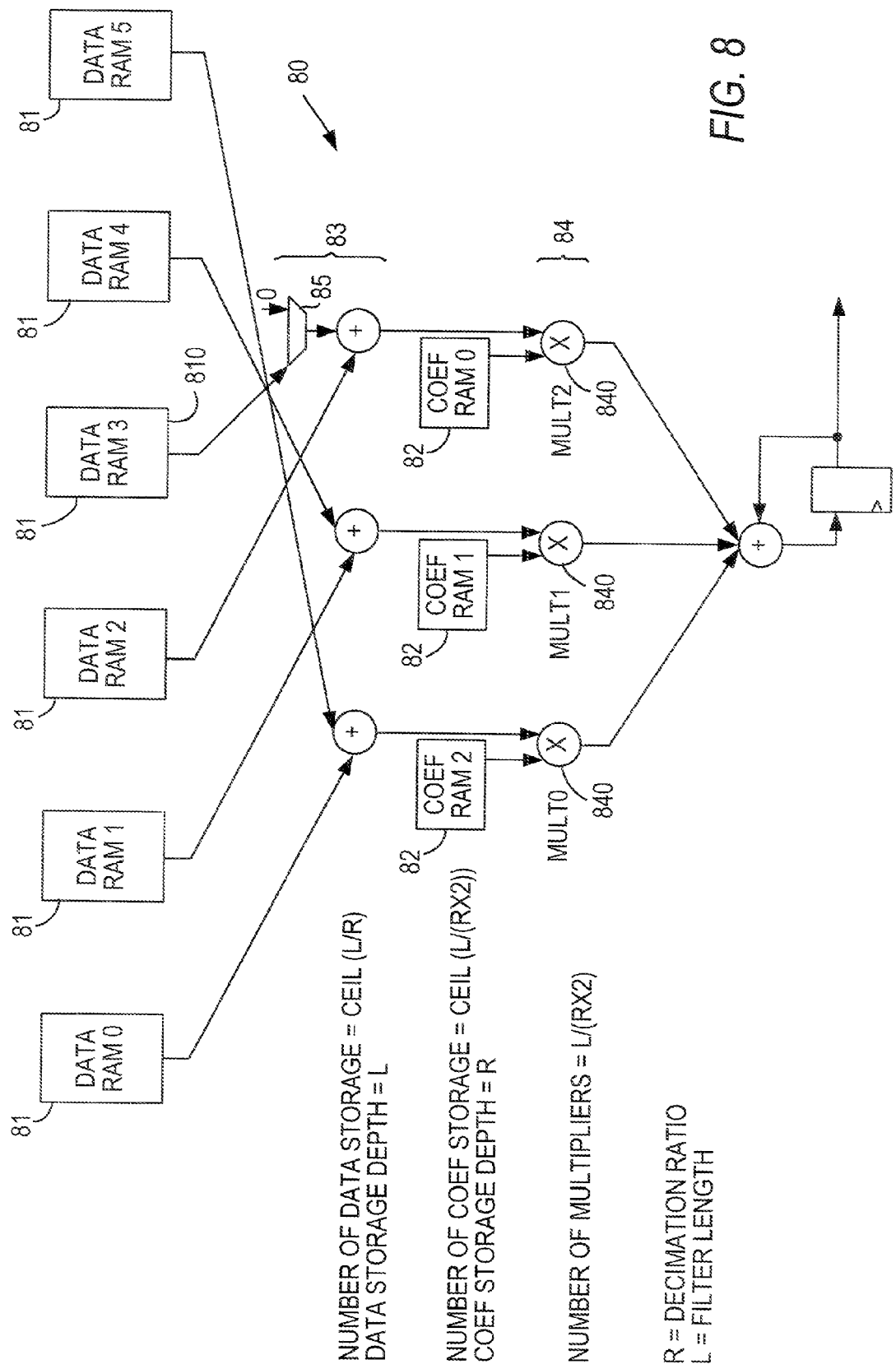

IMPLEMENTATION OF DECIMATION FILTER IN INTEGRATED CIRCUIT DEVICE USING RAM-BASED DATA STORAGE

BACKGROUND OF THE INVENTION

This invention relates to programmable integrated circuits, such as programmable logic devices (PLDs), and, more particularly, to the implementation of filters in specialized processing blocks which may be included in such devices.

As applications for which PLDs are used increase in complexity, it has become more common to design PLDs to include specialized processing blocks in addition to blocks of generic programmable logic resources. Such specialized processing blocks may include a concentration of circuitry on a PLD that has been partly or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

One particularly useful type of specialized processing block that has been provided on PLDs is a digital signal processing (DSP) block, which may be used to process, e.g., audio signals. Such blocks are frequently also referred to as multiply-accumulate ("MAC") blocks, because they include structures to perform multiplication operations, and sums and/or accumulations of multiplication operations.

For example, STRATIX® II and STRATIX® III PLDs sold by Altera Corporation, of San Jose, Calif., include DSP blocks, each of which includes a plurality of multipliers. Each of those DSP blocks also includes adders and registers, as well as programmable connectors (e.g., multiplexers) that allow the various components to be configured in different ways. In each such block, the multipliers can be configured not only as individual multipliers, but also as a number of smaller multipliers, or as one larger multiplier. In addition, one complex multiplication (which decomposes into two multiplication operations for each of the real and imaginary parts) can be performed.

Such a DSP block may be configured as a finite impulse response (FIR) filter. Each block may be used to perform the summation of a plurality of multiplications to form a sub-block of a longer FIR filter.

Many types of FIR filters may be encountered. Two of those types are an interpolation FIR filter—in which the number of samples is increased by a factor of n by inserting ("interpolating") n−1 samples between adjacent samples—and a decimation FIR filter—in which the number of samples is decreased by a factor of n by removing n−1 out of every n samples. A DSP block that may be configured as different types of filters, including an interpolation FIR filter and a decimation FIR filter, is shown in copending, commonly-assigned U.S. patent application Ser. No. 11/447,370, filed Jun. 5, 2006, which is hereby incorporated by reference herein in its entirety.

As described in the above-incorporated application, when a programmable logic device including a DSP block is configured as a decimation filter, portions of the DSP block must run at several times (e.g., three or four times) the input data rate, because the filter must operate several times with different coefficients on the same data before the data is clocked out of the data registers. This is referred to as "overclocking."

It would be desirable to be able to provide a DSP block in a programmable logic device that could perform decimation filtering without having to overclock the DSP block, especially when processing high input data rates.

SUMMARY OF THE INVENTION

The present invention relates to specialized processing blocks for PLDs wherein a specialized processing block can be configured as a FIR filter capable of performing decimation without requiring overclocking. This is achieved by using available random access memory (RAM), commonly available on programmable logic devices, in place of shift registers which are typically implemented in logic elements (LEs) of programmable logic devices. Write and read address generation is used to generate an incremental pointer which mimics shift register behavior. Depending on the symmetry structure—i.e., no symmetry, odd symmetry or even symmetry—the address generation sequence is modified accordingly.

Discrete memory blocks—e.g., one for each multiplier in the filter design—can be used for data storage. This can be done for data, coefficients, or both. Because RAM is being used instead of shift registers, the data or coefficients can be kept in memory for many clock cycles, without being clocked out of the system. Therefore, all portions of the filter, including multipliers and adders/accumulators, can be run at the same rate as the input data samples, which typically is the ordinary programmable logic device clock rate.

The ability to keep all of the data and coefficients in RAM depends on the amount of RAM provided in the programmable logic device. However, using programmable logic devices available from Altera Corporation, of San Jose, Calif., as an example, it is typical to provide RAM in programmable logic devices in blocks of 512 bits or 4 kilobits. This is expected to be sufficient for most decimation filter applications, except possibly applications that require multiple filters on a single device.

Therefore, in accordance with the present invention, there is provided a FIR filter structure for operating in decimation filter mode. The FIR filter structure includes a first number of multipliers each corresponding to one or more taps of the FIR filter structure, each of the multipliers having first and second multiplicand inputs. A second number of coefficient memories is provided, each respective one of the coefficient memories being connected to the first multiplicand input of a respective one of the multipliers, and has capacity to store a third number of coefficients. A fourth number of data sample memories is provided, each respective one of the data sample memories being connected to the second multiplicand input of a respective one of the multipliers, and has capacity to store a fifth number of data samples. All of the multipliers, the coefficient memories, and the data sample memories operate at a single clock rate.

A programmable logic device so configured, and a method of so configuring a programmable logic device, are also provided.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 4 shows a preferred embodiment of a data loading schedule, and corresponding coefficients, for a generic decimation filter with twelve taps and a decimation factor of two, of which the filter in FIG. 3 is an example;

FIGS. 7A, 7B and 7C (hereinafter collectively referred to as FIG. 7) show a preferred embodiment of a read/write sequence for the data and coefficient memories in the filter of FIG. 6;

FIG. 8 is a schematic representation of an odd-symmetric decimation filter implemented in accordance with a preferred embodiment of the present invention;

FIGS. 9A, 9B and 9C (hereinafter collectively referred to as FIG. 9) show a preferred embodiment of a read/write sequence for the data and coefficient memories in the filter of FIG. 8;

DETAILED DESCRIPTION OF THE INVENTION

A FIR filter calculates a weighted sum of a finite number of inputs, summing a number of multiplication results, where each multiplication is between a sample and a coefficient. Each such multiplication may be referred to as a "tap." Mathematically, a FIR filter may be described as:

$$Y_k = \sum_{i=0}^{Taps-1} c_i \cdot s_{k-i}$$

where $Y_k$ is the kth output term, $c_i$ is the ith coefficient, $S_{k-i}$ is the (k-i)th input sample, and Taps is the number of taps or length of the filter.

Figure 1:
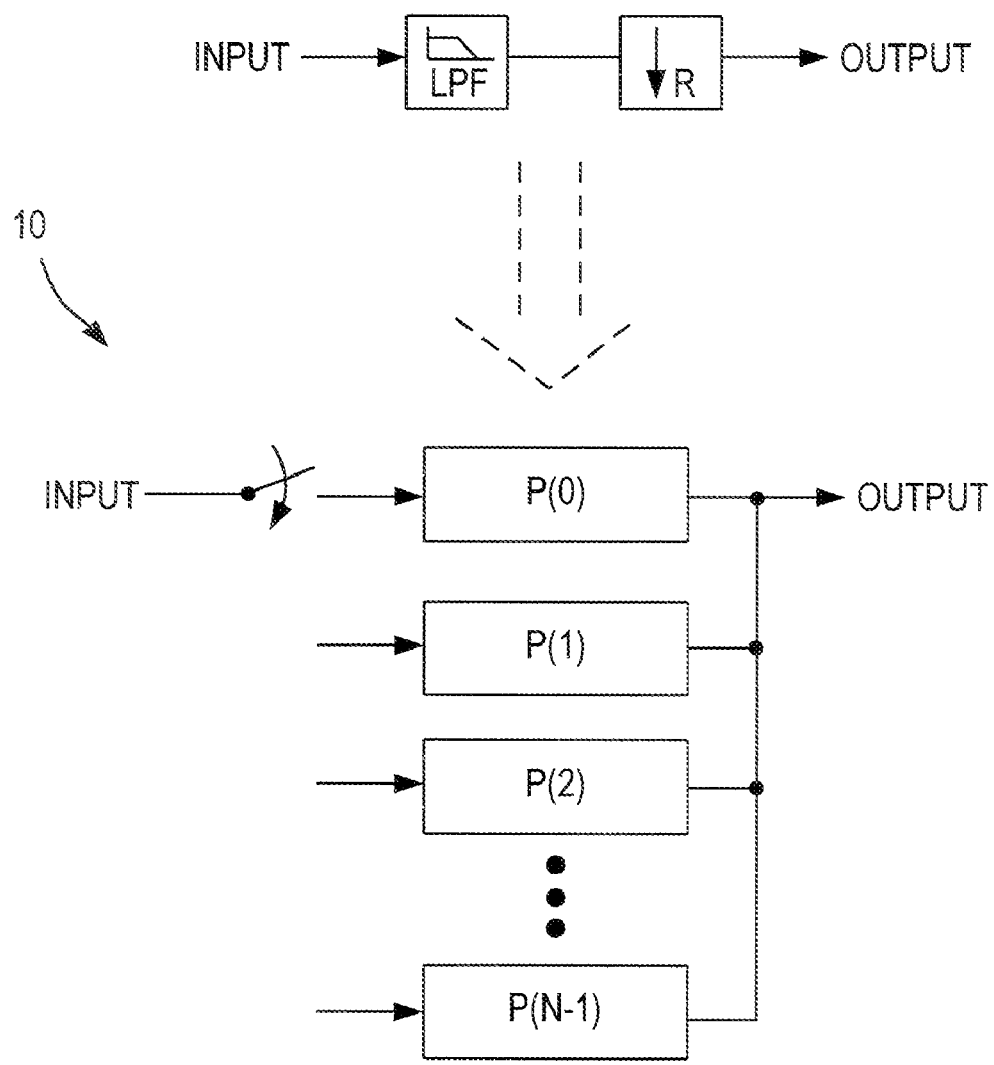
FIG. 1 is a conceptual representation of a decimation filter.
Figure 2:
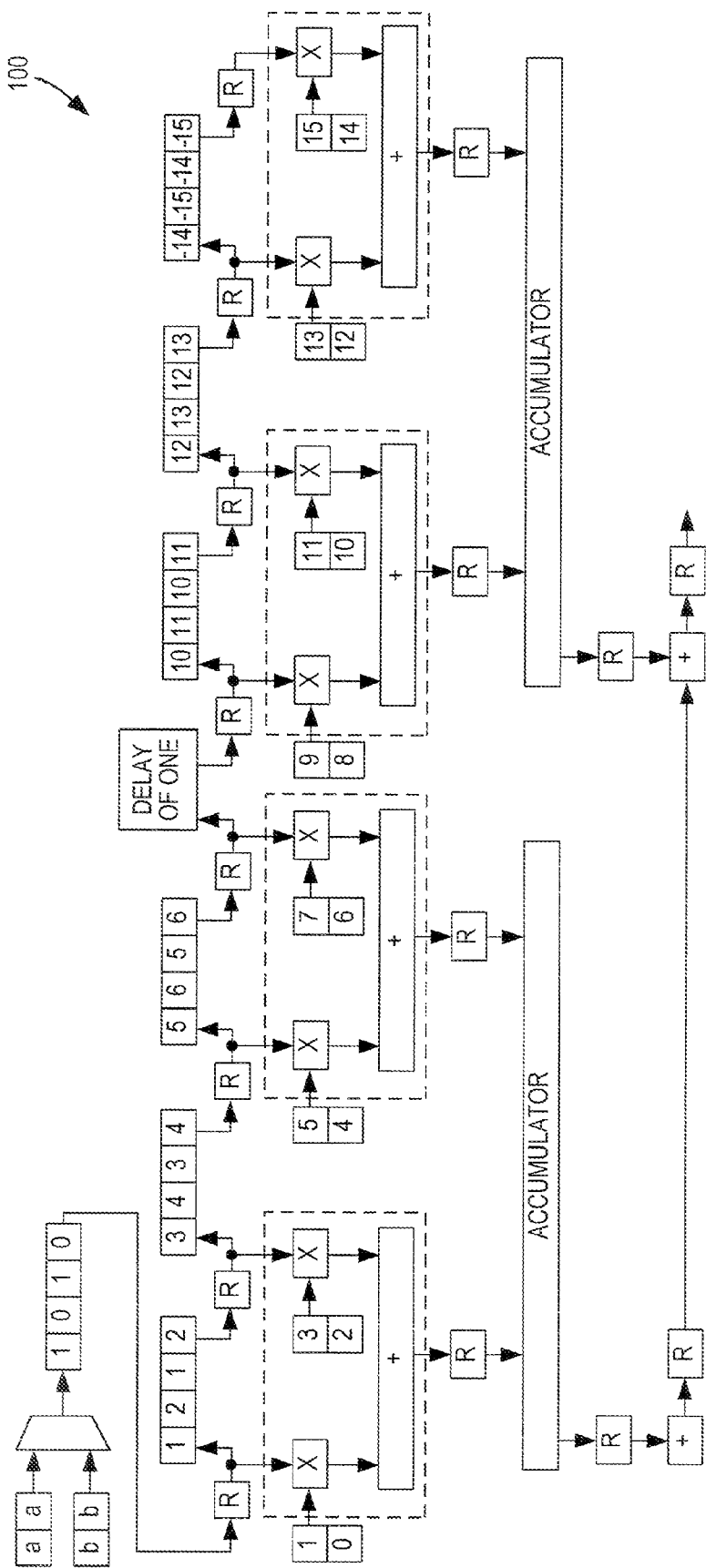
FIG. 2 is a schematic representation of a multi-channel semi-parallel FIR filter can function as a decimation filter, with overclocking.

Decimation filters are used when a signal is resampled at a lower rate. When a high-frequency filter is sampled at a lower rate, data is lost. The higher frequency components may fold back into the signal, so low-pass filtering is needed to prevent distortion of the signal. A generic decimation filter structure 10 is shown in FIG. 1. In this case, the filter preferably is like a multi-channel semi-parallel filter 100 as shown in FIG. 2, with all of the phases being accumulated together. The input is at LF Hz and the output is at F Hz—i.e., the overclocking is on the input side.

In accordance with the present invention, data samples and coefficients preferably are stored in RAM, which is relatively plentiful on programmable logic devices, so that a decimation filter can be run at the same rate as the input data samples.

Preferably, this is achieved by implementing respective discrete memory blocks for storage of data and coefficients for each respective multiplier in the filter design. The order in which each new input sample data is written into its respective memory block preferably is based on the symmetry structure (i.e., no symmetry, even symmetry or odd symmetry). The read address logic preferably is a simple incremental pointer which preferably mimics shift register behavior. Similarly, the order of the read address preferably is modified according to the symmetry structure. Preferably, the read/write address generator may implemented in programmable logic of the programmable logic device.

Figure 3:
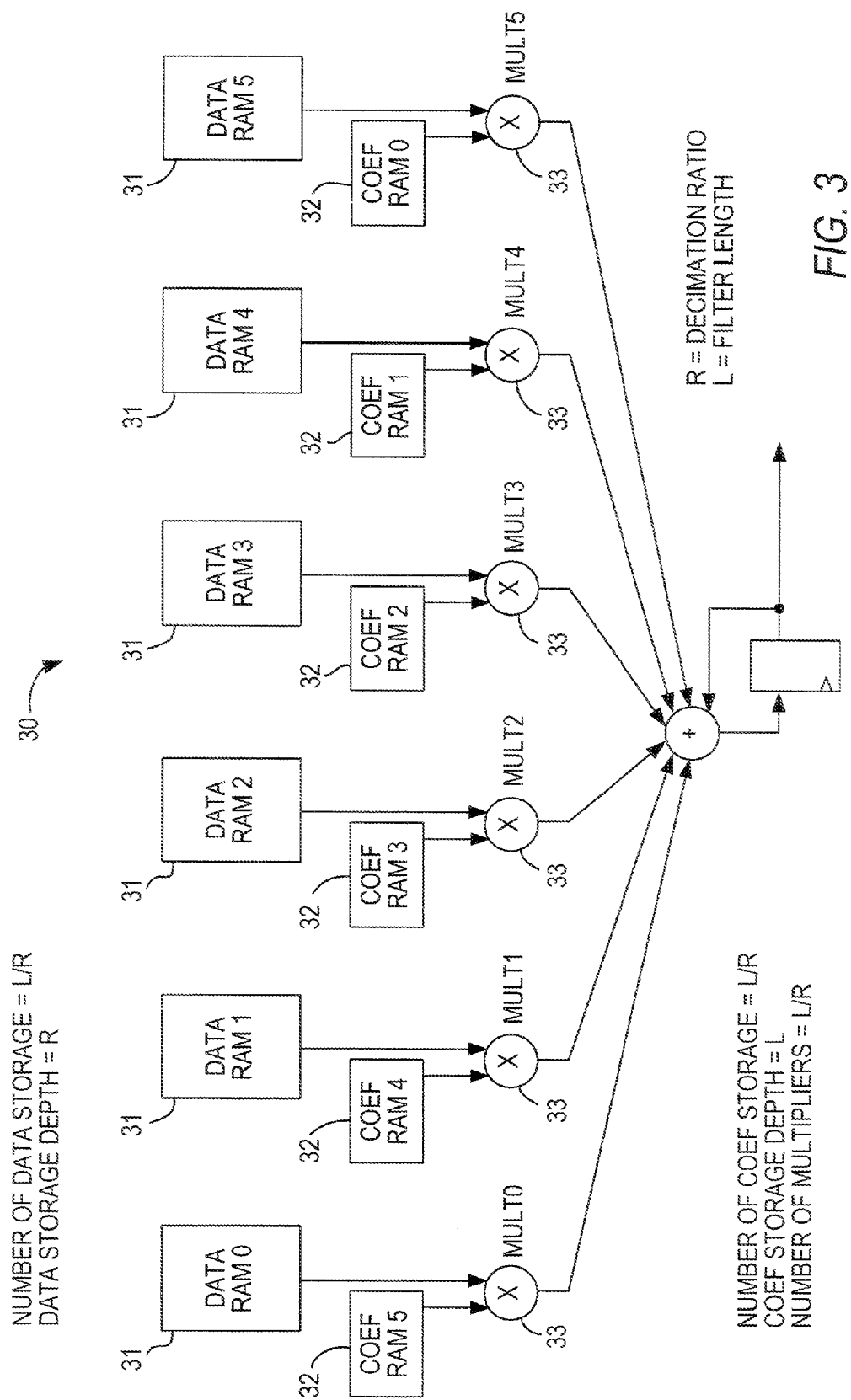
FIG. 3 is a schematic representation of a non-symmetric decimation filter implemented in accordance with a preferred embodiment of the present invention.

Using a 12-tap decimate-by-2 filter as an example, the filter coefficients are: C1, C2, C3, . . . , C11, C12. With a decimation ratio of 2, every other output sample is discarded. Hence, it decreases the output sample rate by a factor of 2. FIG. 3 is a block diagram of a non-symmetric decimation filter 30 implemented using memory buffers 31, 32 for both data and coefficient storage. For a decimate-by-2 filter, the output sample rate is reduced by a factor of 2, where each filter output can be calculated in 2 clock cycles. Hence, the number of multipliers 33 can be reduced using the time-domain multiplexing (TDM) technique. In this case, the number of multipliers 33 is 6=L/R, where L is the full length of the filter and R is the decimation ratio. Each data buffer 31 preferably has a depth equivalent to R. Each coefficient buffer 32 preferably stores all the coefficients—i.e., it has a depth equivalent to L.

The table of FIG. 4 shows the data loading schedule into the tap delay line for a 12-tap decimate-by-2 filter, of which filter 30 is one example, and the corresponding coefficient that each data sample is being multiplied with at each clock cycle. The numbers in each cell of the table refer to the nth input data sample feeding into the filter as the data is shifted in from the right.

In this example, it is possible to decompose the filter into two phases, with 6 taps each, and calculate each output in 2 clock cycles. Coupled with the time-domain multiplexing (TDM) approach, only six multipliers are required. In accordance with the present invention, the filter can run at the input sample rate, storing the data in, e.g., memory blocks 31 in the example of FIG. 3.

Figure 5:
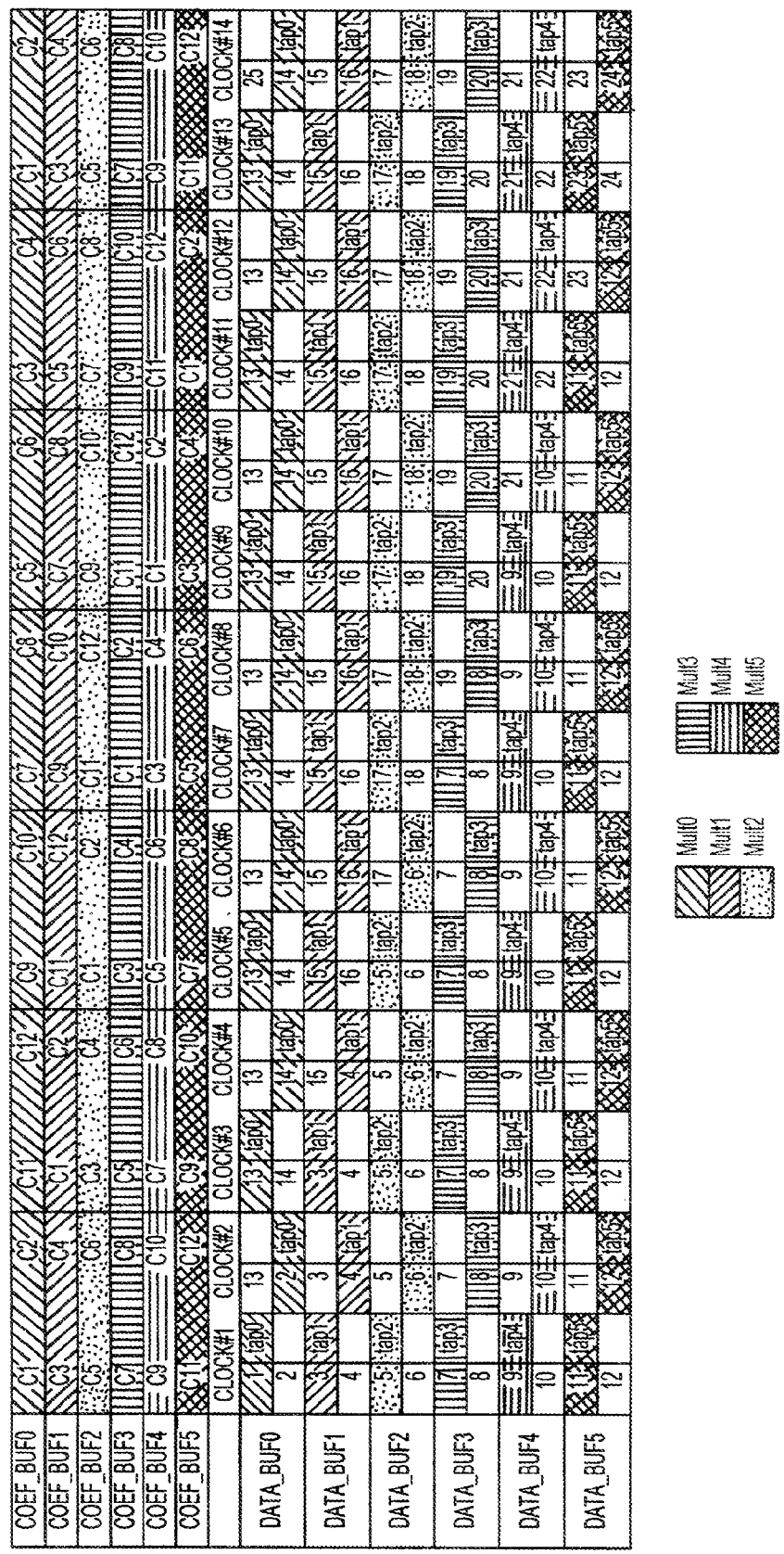
FIG. 5 shows a preferred embodiment of a read/write sequence for the data and coefficient memories in the filter of FIG. 3.

The table in FIG. 5 shows a preferred write and read sequence from memory buffers, such as the six data memory buffers 31, storing data and the output from each coefficient buffer, such as coefficient buffers 32, for a non-symmetric filter structure. The data write address generation preferably uses a round robin schedule targeting all six data memory buffers. The data read address generation (shown by the various shading patterns, which correspond to the various multipliers) preferably is identical across all the data memory buffers 31. The coefficients preferably are rotated to accommodate the shifts in each clock cycle. In the drawing, different shading signifies a different one of multipliers 33.

In a case of even symmetry, continuing to use the example of a 12-tap decimate-by-2 filter, the coefficients are centered around C6 and C7:

C1=C12, C2=C11, C3=C10, C4=C9, C5=C8, C6=C7

Figure 6:
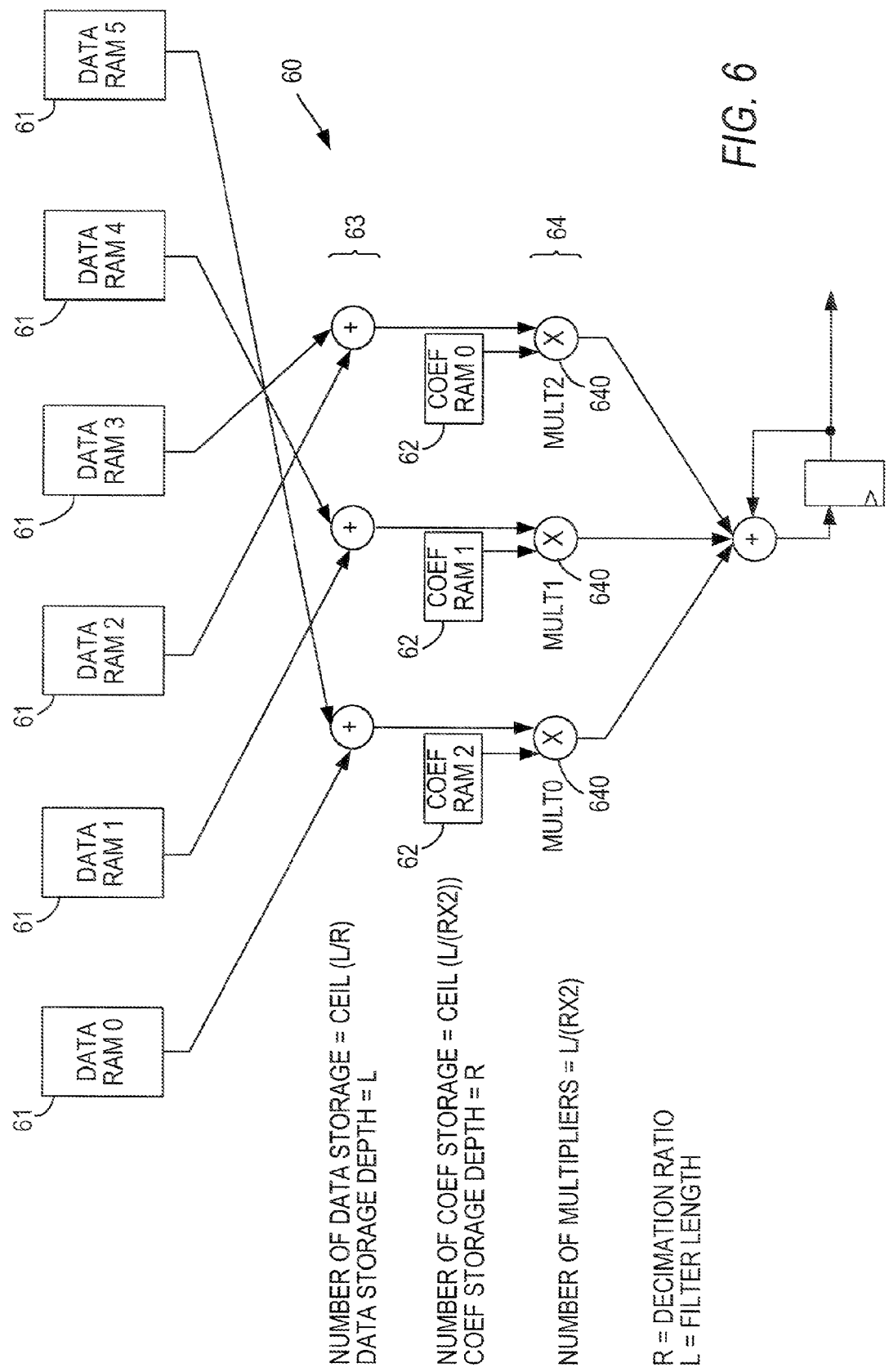
FIG. 6 is a schematic representation of an even-symmetric decimation filter implemented in accordance with a preferred embodiment of the present invention.

FIG. 6 is a block diagram of an even-symmetric decimation filter 60 implemented using memory buffers 61, 62 for both data and coefficient storage. With even filter symmetry, the input data may be pre-added at 63 prior to the multiplier stage 64. This reduces the number of multipliers 640 by half. For a decimate-by-2 filter, the output sample rate also is reduced by a factor of 2, where each filter output can be calculated in two clock cycles. Hence, the number of multipliers 640 can be reduced further using time-domain multiplexing. The total number of multipliers 640 is L/(2R), where L is the filter length, and R is the decimation ratio. Preferably, all data buffers 61 have the same content and each data buffer 61 has a depth equivalent to L, the full length of the filter, while each coefficient buffer 62 stores R coefficients.

Figure 7A:
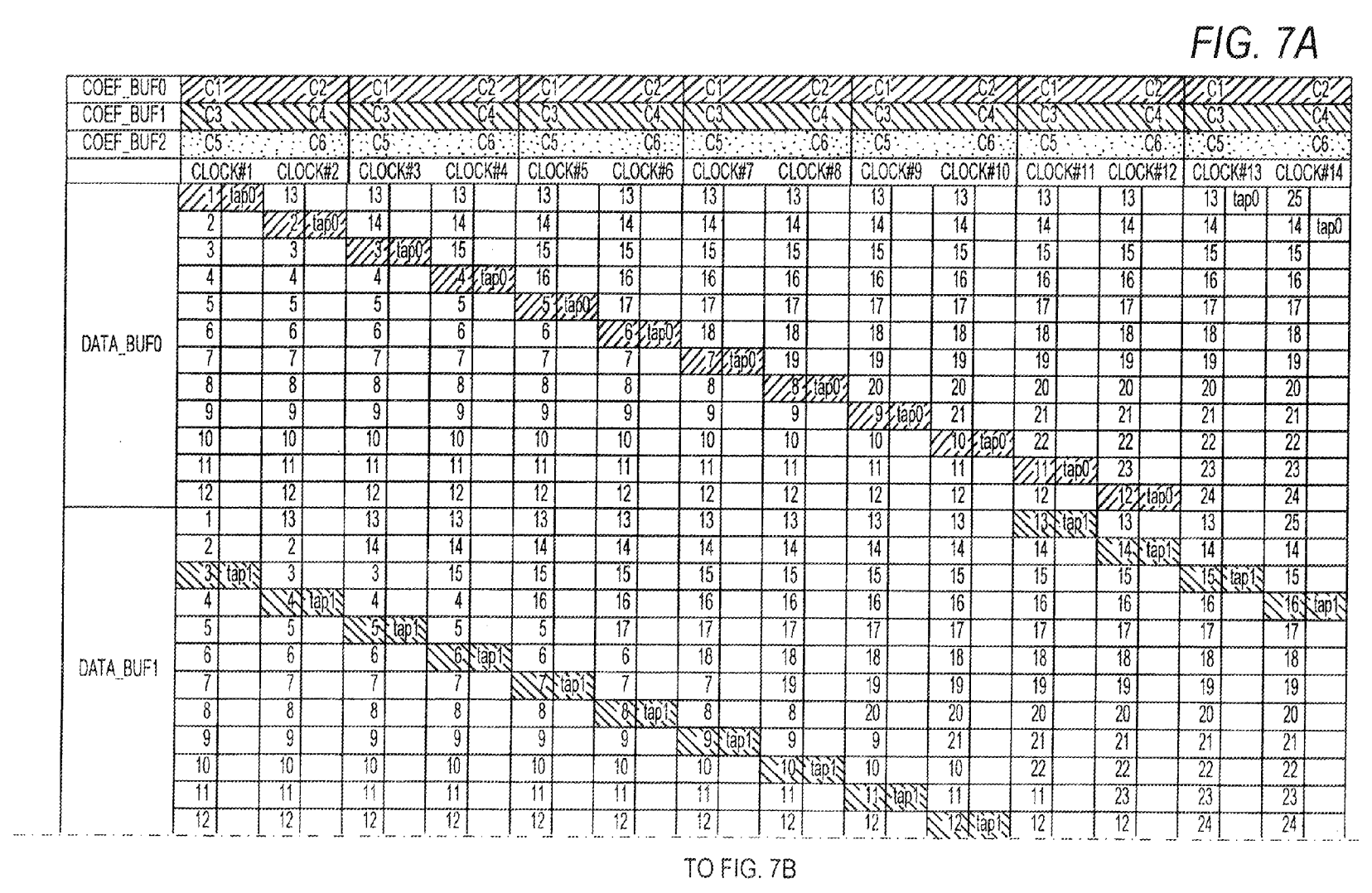
Figure 7B:
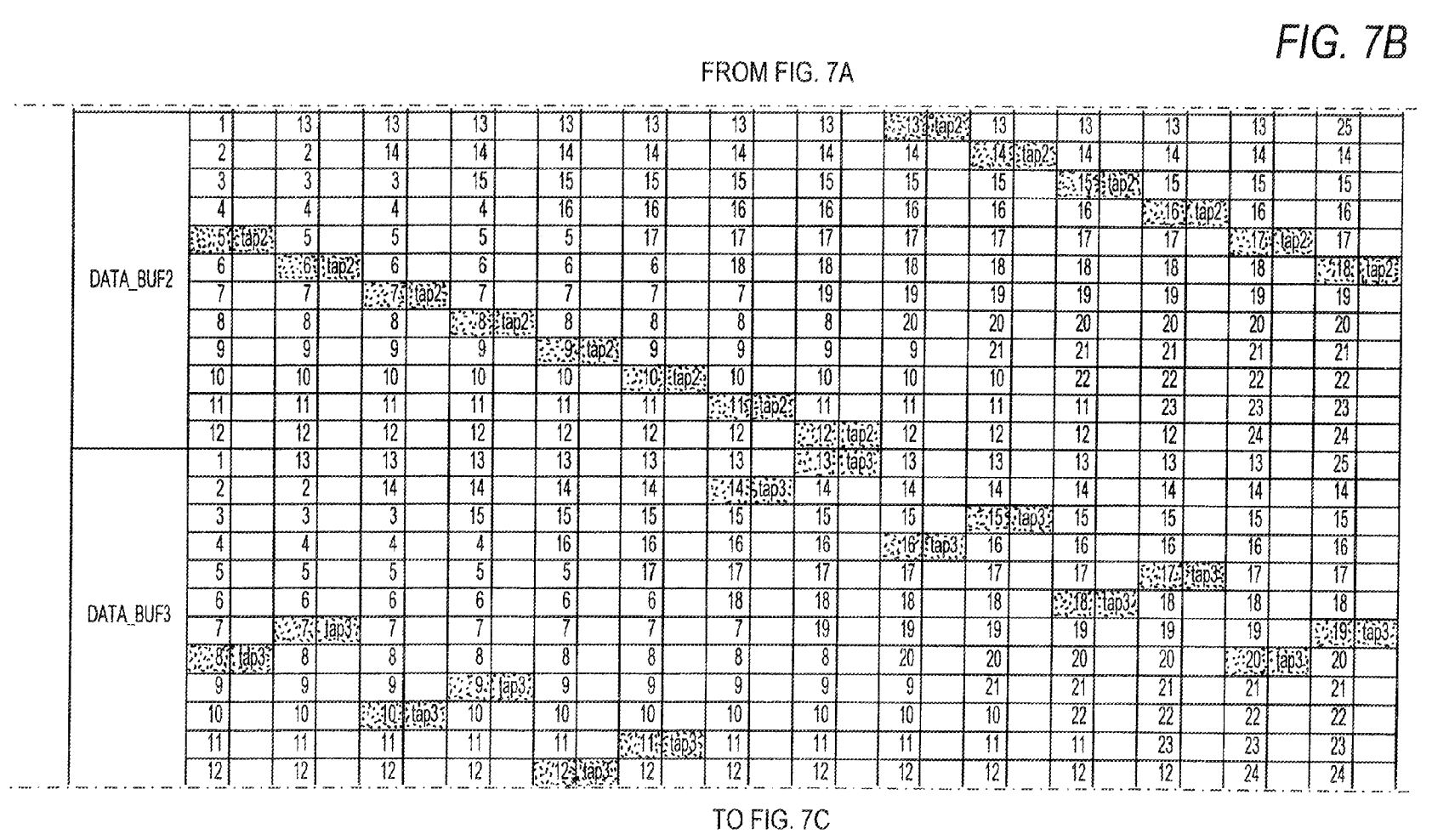
Figure 7C:
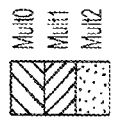

The table in FIG. 7 shows the write and read sequence from the six memory buffers 61 storing data and the output from each coefficient buffer 62 for an even-symmetric filter structure 60. The data write address generation preferably is shared across all the data memory buffers 61 and the content of all data buffers 61 preferably is identical as discussed above. The data read address generation (shown by the shaded blocks) preferably has two distinct sequences—ascending order (with offset) for the first half of data buffers 61, and pseudo-descending order (with offset) for the second half of the data buffers 61. The coefficients preferably are read in a round-robin fashion. In the drawing, different shading signifies a different one of multipliers 640.

In a case of odd symmetry, continuing to use the example of a 12-tap decimate-by-2 filter, the coefficients are centered on C6:

C1=C11, C2=C10, C3=C9, C4=C8, C5=C7

FIG. 8 is a block diagram of an odd-symmetric decimation filter 80 implemented using memory buffers 81, 82 for both data and coefficient storage. With odd filter symmetry, the input data is pre-added at 83 prior to the multiplier stage 84. The exception is with the data sample associated with the center tap. The multiplexer 85 associated with data buffer 810 allows bypassing of pre-adder stage 83 for the center tap. The select line for multiplexer 85 is made active every other cycle to coincide with the middle tap corresponding to C6. With even filter symmetry, this reduces the number of multipliers 840 by half. For the decimate-by-2 filter, the output sample rate also is reduced by a factor of 2, where each filter output can be calculated in two clock cycles. Hence, the number of multipliers can be reduced further using TDM. The total number of multipliers 840 is L/(2R), where L is the filter length, and R is the decimation ratio. Preferably, all data buffers 81 have the same content and each data buffer 81 preferably has a depth equivalent to L, the full length of the filter. Each coefficient buffer 82 preferably stores R coefficients.

Figure 9A:
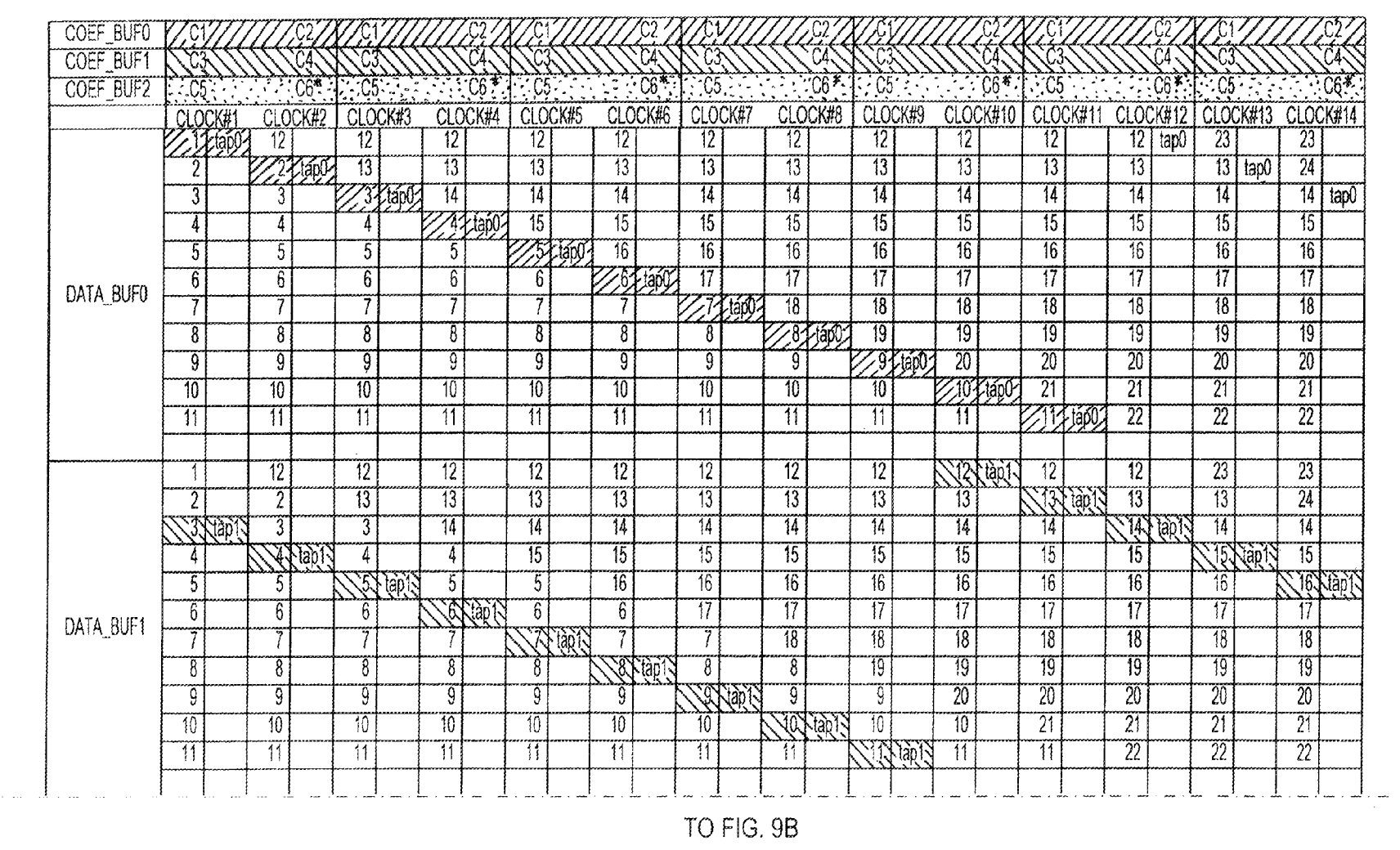
Figure 9B:
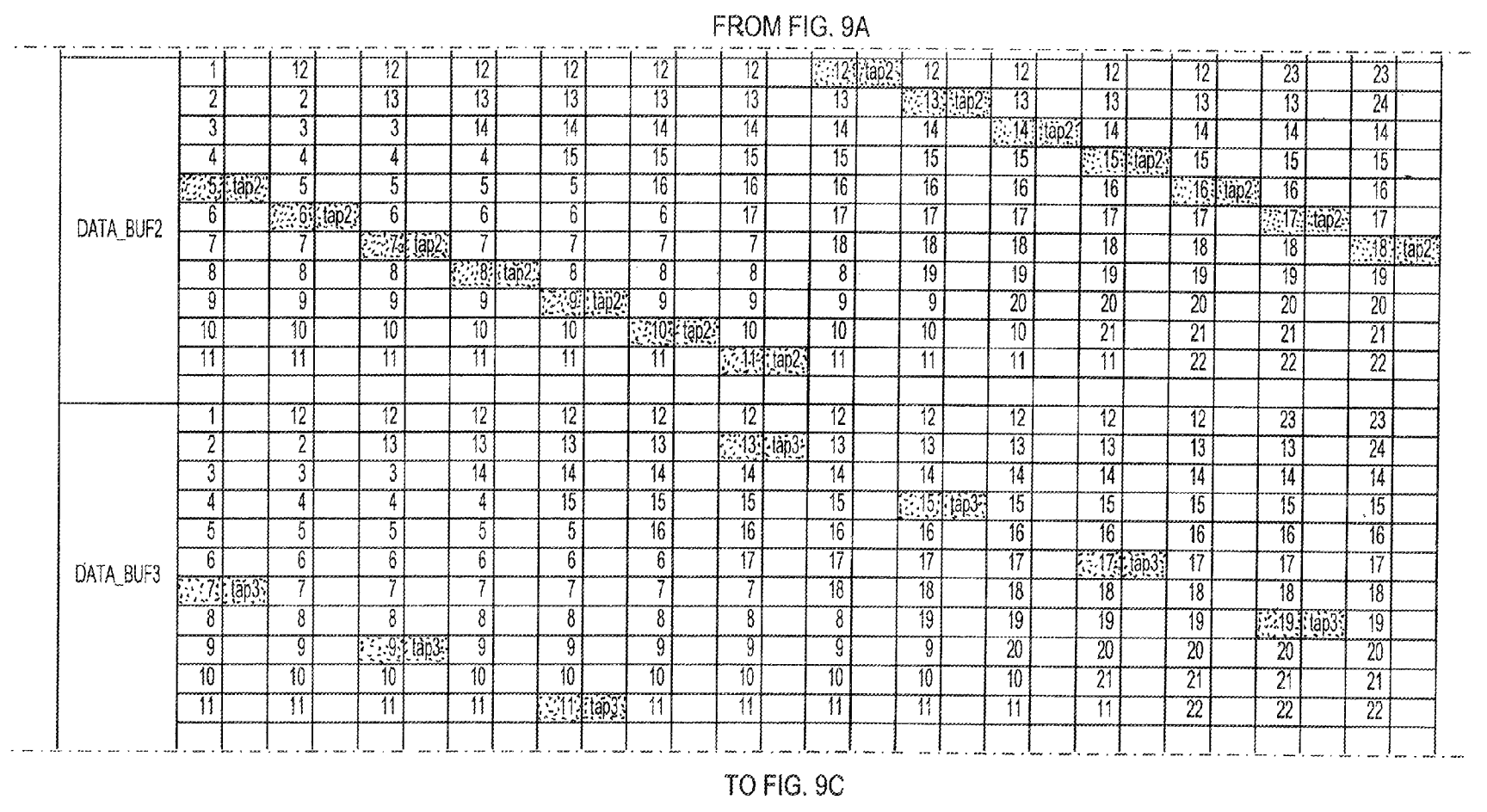
Figure 9C:
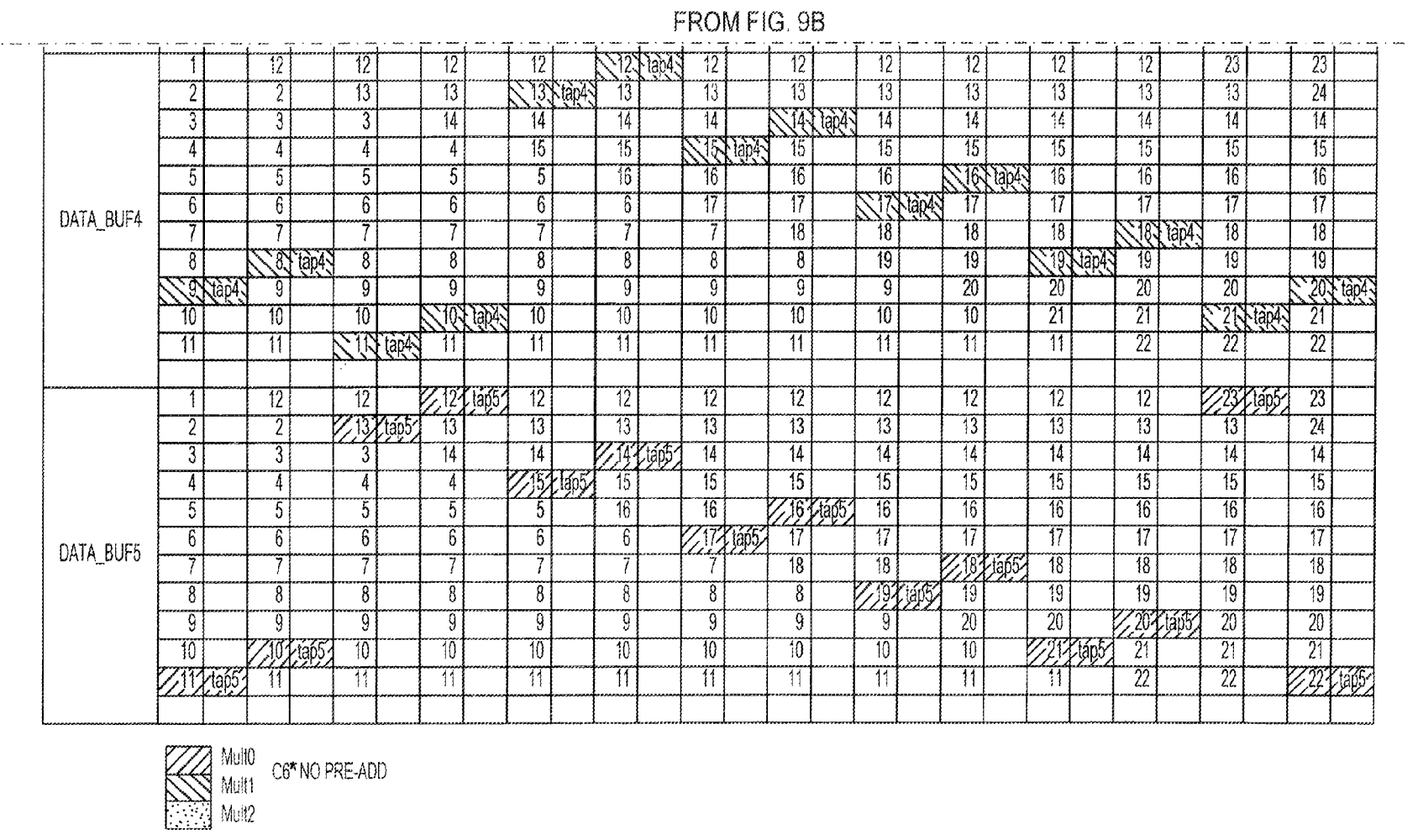

The table in FIG. 9 shows the write and read sequence from the six memory buffers 81 storing data and the output from each coefficient buffer 82 for an odd-symmetric filter structure 80. The data write address generation preferably is shared across all the data memory buffers 81 and the content of the data buffers preferably is identical as discussed above. The data read address generation (shown in the shaded blocks) preferably has two distinct sequences—ascending order (with offset) for the first half of data buffers 81, and a pseudo-descending order (with offset) for the second half of data buffers 81. The coefficients preferably are read in a round-robin fashion. In the drawing, different shading signifies a different one of multipliers 840.

The foregoing examples of decimation filters having particular lengths, symmetry and decimation ratios are illustrative only. The present invention allows the use of memory blocks as data storage and coefficient storage for decimation filters, while maintaining the filter sample rate to be equal to the input sample rate. Filters implemented in accordance with the present invention do not require overclocking. With high input sample rates—e.g., over 200 MHz for a decimation filter used in digital down-converters in digital receivers, current technology does not allow devices to run at three times the input rate. Therefore, such filters might not be able to be implemented without the present invention. Even for filters with input sample rates below about 100 MHz, where the required overclocking may be possible, the requirement for overclocking may impose additional constraints on the overall design. The present invention overcomes these difficulties by making better utilization of abundant memory blocks provided on many programmable logic devices.

Figure 10:
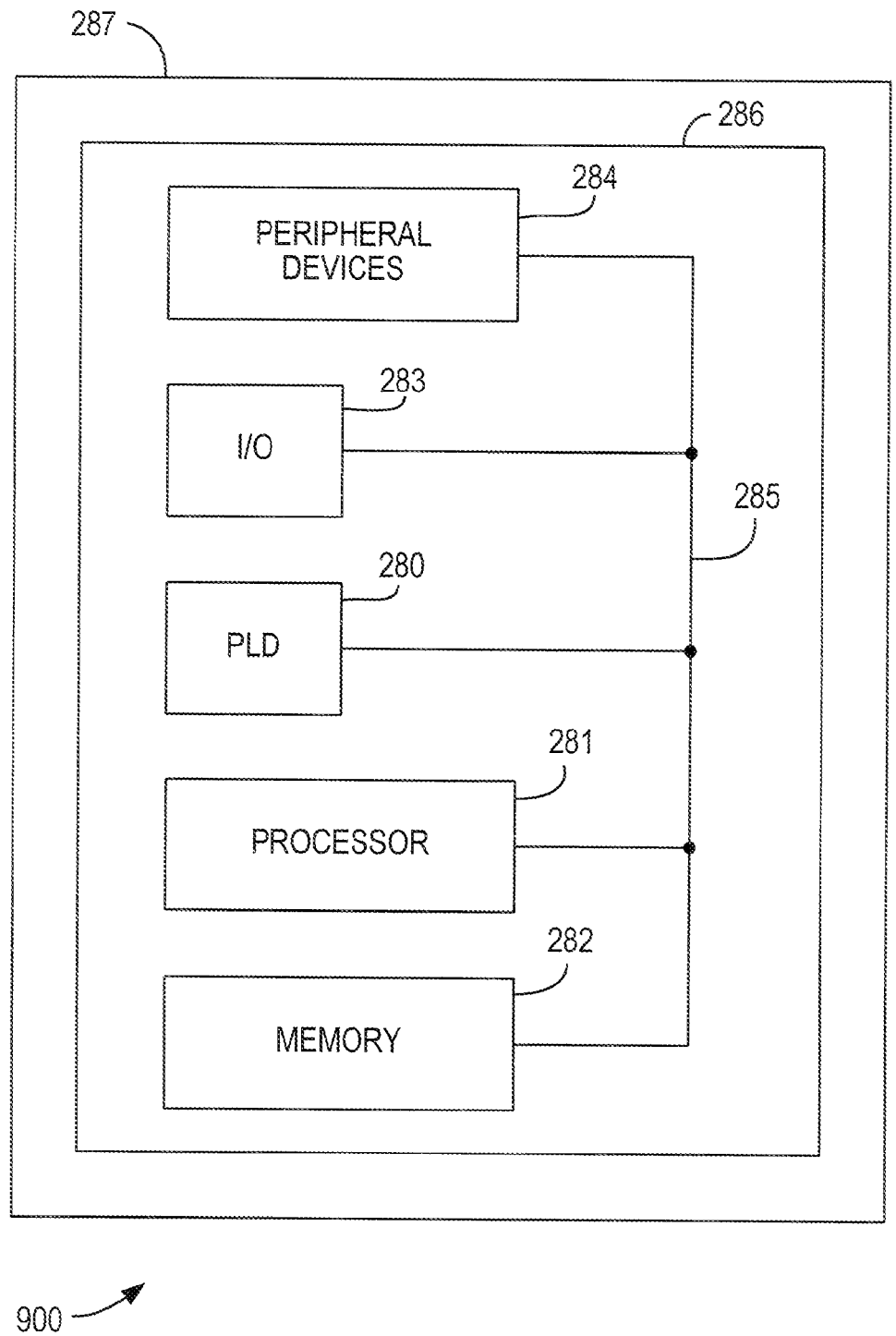
FIG. 10 is a simplified block diagram of an illustrative system employing a programmable logic device incorporating the present invention.

A PLD 280 incorporating such circuitry according to the present invention may be used in many kinds of electronic devices. One possible use is in a data processing system 900 shown in FIG. 10. Data processing system 900 may include one or more of the following components: a processor 281; memory 282; I/O circuitry 283; and peripheral devices 284. These components are coupled together by a system bus 285 and are populated on a circuit board 286 which is contained in an end-user system 287.

System 900 can be used in a wide variety of applications, such as computer networking, data networking, instrumentation, video processing, digital signal processing, or any other application where the advantage of using programmable or reprogrammable logic is desirable. PLD 280 can be used to perform a variety of different logic functions. For example, PLD 280 can be configured as a processor or controller that works in cooperation with processor 281. PLD 280 may also be used as an arbiter for arbitrating access to a shared resources in system 900. In yet another example, PLD 280 can be configured as an interface between processor 281 and one of the other components in system 900. It should be noted that system 900 is only exemplary, and that the true scope and spirit of the invention should be indicated by the following claims.

Various technologies can be used to implement PLDs 280 as described above and incorporating this invention.

Instructions for carrying out the method according to this invention may be encoded on a machine-readable medium, to be executed by a suitable computer or similar device to implement the method of the invention for programming PLDs. For example, a personal computer may be equipped with an interface to which a PLD can be connected, and the personal computer can be used by a user to program the PLD using a suitable software tool, such as the QUARTUS® II software available from Altera Corporation, of San Jose, Calif.

Figure 11:
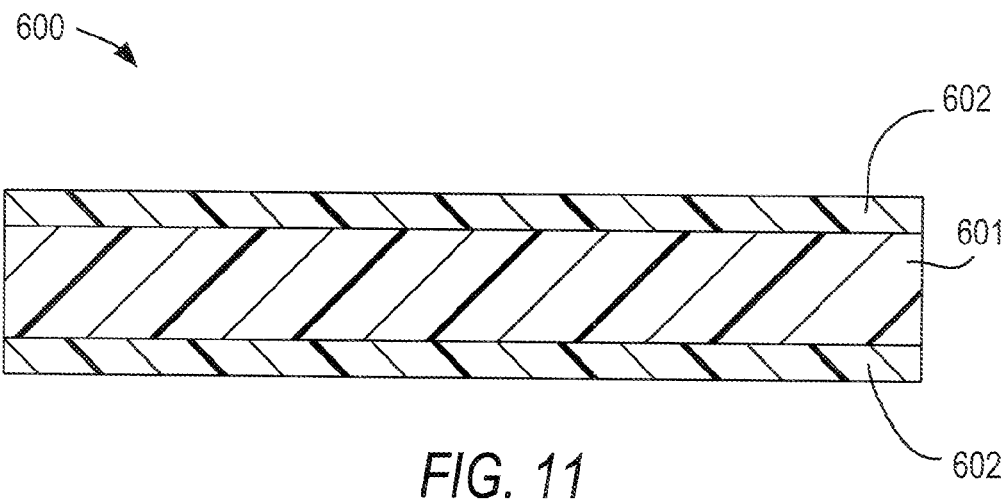
FIG. 11 is a cross-sectional view of a magnetic data storage medium encoded with a set of machine-executable instructions for performing the method according to the present invention.

FIG. 11 presents a cross section of a magnetic data storage medium 600 which can be encoded with a machine executable program that can be carried out by systems such as the aforementioned personal computer, or other computer or similar device. Medium 600 can be a floppy diskette or hard disk, or magnetic tape, having a suitable substrate 601, which may be conventional, and a suitable coating 602, which may be conventional, on one or both sides, containing magnetic domains (not visible) whose polarity or orientation can be altered magnetically. Except in the case where it is magnetic tape, medium 600 may also have an opening (not shown) for receiving the spindle of a disk drive or other data storage device.

The magnetic domains of coating 602 of medium 600 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 12:
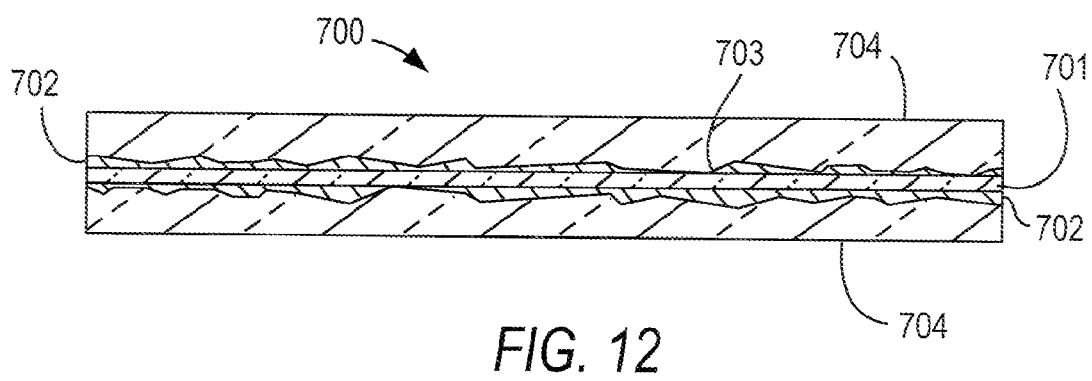
FIG. 12 is a cross-sectional view of an optically readable data storage medium encoded with a set of machine executable instructions for performing the method according to the present invention.

FIG. 12 shows a cross section of an optically-readable data storage medium 700 which also can be encoded with such a machine-executable program, which can be carried out by systems such as the aforementioned personal computer, or other computer or similar device. Medium 700 can be a conventional compact disk read only memory (CD-ROM) or digital video disk read only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 700 preferably has a suitable substrate 701, which may be conventional, and a suitable coating 702, which may be conventional, usually on one or both sides of substrate 701.

In the case of a CD-based or DVD-based medium, as is well known, coating 702 is reflective and is impressed with a plurality of pits 703, arranged on one or more layers, to encode the machine-executable program. The arrangement of pits is read by reflecting laser light off the surface of coating 702. A protective coating 704, which preferably is substantially transparent, is provided on top of coating 702.

In the case of magneto-optical disk, as is well known, coating 702 has no pits 703, but has a plurality of magnetic domains whose polarity or orientation can be changed magnetically when heated above a certain temperature, as by a laser (not shown). The orientation of the domains can be read by measuring the polarization of laser light reflected from coating 702. The arrangement of the domains encodes the program as described above.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement, or on any other type of integrated circuit device with embedded memory. One skilled in the art will appreciate that the present invention can be practiced by other than the described embodiments, which are presented for purposes of illustration and not of limitation, and the present invention is limited only by the claims that follow.

What is claimed is:

1. A FIR filter structure for operating in decimation filter mode; said FIR filter structure comprising:
   a first number of multipliers each corresponding to one or more taps of said FIR filter structure, each of said multipliers having first and second multiplicand inputs;
   a second number of coefficient memories, each respective one of said coefficient memories being connected to said first multiplicand input of a respective one of said multipliers, and having capacity to store a third number of coefficients; and
   a fourth number of data sample memories, each respective one of said data sample memories being connected to said second multiplicand input of a respective one of said multipliers, and having capacity to store a fifth number of data samples; wherein:
   all of said multipliers, said coefficient memories, and said data sample memories operate at a single clock rate.

2. The FIR filter structure of claim 1 wherein:
   said FIR filter structure is implemented in an integrated circuit comprising at least one block of user-configurable random access memory; and
   said coefficient memories and said data sample memories are implemented in said at least one block of user-configurable random access memory.

3. The FIR filter structure of claim 2 wherein said integrated circuit comprises a programmable logic device.

4. The FIR filter structure of claim 1 wherein:
   said FIR filter structure operates in a non-symmetric decimation filter mode having a length and a decimation factor;
   each of said multipliers corresponds to one tap of said FIR filter structure;
   said first number is equal to a quotient of said length and said decimation factor;
   said second number is equal to said first number;
   said third number is equal to said length;
   said fourth number is equal to said first number; and
   said fifth number is equal to said decimation factor.

5. The FIR filter structure of claim 1 wherein:
   said FIR filter structure operates in an even-symmetric decimation filter mode having a length and a decimation factor;
   each of said multipliers corresponds to two taps of said FIR filter structure;
   said first number is equal to one-half a quotient of said length and said decimation factor;
   said second number is equal to said first number;
   said third number is equal to said decimation factor;
   said fourth number is equal to twice said first number; and
   said fifth number is equal to said length.

6. The FIR filter structure of claim 1 wherein:
   said FIR filter structure operates in an odd-symmetric decimation filter mode having a length and a decimation factor;
   said FIR filter structure further comprises a multiplexer between one of said data sample memories and one of said multipliers, whereby a zero input can be selected for said one of said multipliers;
   each of said multipliers, except for said one of said multipliers, corresponds to two taps of said FIR filter structure, and said one of said multipliers corresponds to one tap of said FIR filter structure;
   said first number is equal to one-half a quotient of said length and said decimation factor;
   said second number is equal to said first number;
   said third number is equal to said decimation factor;
   said fourth number is equal to twice said first number; and
   said fifth number is equal to said length.

7. An integrated circuit device configured as a FIR filter for operating in one of decimation filter mode, said integrated circuit device having a plurality of multipliers and at least one user-configurable block of random access memory and comprising:
   a first number of multipliers each corresponding to one or more taps of said FIR filter, each of said multipliers having first and second multiplicand inputs;
   a second number of coefficient memories configured from said at least one user-configurable block of random access memory, each respective one of said coefficient memories being connected to said first multiplicand input of a respective one of said multipliers, and having capacity to store a third number of coefficients; and
   a fourth number of data sample memories configured from said at least one user-configurable block of random access memory, each respective one of said data sample memories being connected to said second multiplicand input of a respective one of said multipliers, and having capacity to store a fifth number of data samples; wherein:
   all of said multipliers, said coefficient memories, and said data sample memories operate at a single clock rate.

8. The integrated circuit device of claim 7 wherein:
   said FIR filter operates in a non-symmetric decimation filter mode having a length and a decimation factor;
   each of said multipliers corresponds to one tap of said FIR filter;

said first number is equal to a quotient of said length and said decimation factor;
said second number is equal to said first number;
said third number is equal to said length;
said fourth number is equal to said first number; and
said fifth number is equal to said decimation factor.

9. The integrated circuit device of claim 7 wherein:
said FIR filter operates in an even-symmetric decimation filter mode having a length and a decimation factor;
each of said multipliers corresponds to two taps of said FIR filter;
said first number is equal to one-half a quotient of said length and said decimation factor;
said second number is equal to said first number;
said third number is equal to said decimation factor;
said fourth number is equal to twice said first number; and
said fifth number is equal to said length.

10. The integrated circuit device of claim 7 wherein:
said FIR filter operates in an odd-symmetric decimation filter mode having a length and a decimation factor;
said FIR filter further comprises a multiplexer between one of said data sample memories and one of said multipliers, whereby a zero input can be selected for said one of said multipliers;
each of said multipliers, except for said one of said multipliers, corresponds to two taps of said FIR filter, and said one of said multipliers corresponds to one tap of said FIR filter;
said first number is equal to one-half a quotient of said length and said decimation factor;
said second number is equal to said first number;
said third number is equal to said decimation factor;
said fourth number is equal to twice said first number; and
said fifth number is equal to said length.

11. The integrated circuit device of claim 7, wherein said integrated circuit device comprises a programmable logic device.

12. A method of programmably configuring an integrated circuit device as a FIR filter for operating in decimation filter mode, said integrated circuit device having a plurality of multipliers and at least one user-configurable block of random access memory, said method comprising:
programmably configuring a first number of multipliers to each correspond to one or more taps of said FIR filter, each of said multipliers having first and second multiplicand inputs;
programmably configuring a second number of coefficient memories from said at least one user-configurable block of random access memory, each respective one of said coefficient memories being connected to said first multiplicand input of a respective one of said multipliers, and having capacity to store a third number of coefficients;
programmably configuring a fourth number of data sample memories from said at least one user-configurable block of random access memory, each respective one of said data sample memories being connected to said second multiplicand input of a respective one of said multipliers, and having capacity to store a fifth number of data samples; and
programmably configuring data read patterns for reading said data samples and said coefficients from said at least one user-configurable random access memory in an order corresponding to shifting of said data samples and said coefficients through said FIR filter.

13. The method of claim 12 wherein:
said integrated circuit device is configured as a FIR filter that operates in a non-symmetric decimation filter mode having a length and a decimation factor;
each of said multipliers corresponds to one tap of said FIR filter;
said first number is equal to a quotient of said length and said decimation factor;
said second number is equal to said first number;
said third number is equal to said length;
said fourth number is equal to said first number; and
said fifth number is equal to said decimation factor.

14. The method of claim 12 wherein:
said integrated circuit device is configured as a FIR filter structure that operates in an even-symmetric decimation filter mode having a length and a decimation factor;
each of said multipliers corresponds to two taps of said FIR filter;
said first number is equal to one-half a quotient of said length and said decimation factor;
said second number is equal to said first number;
said third number is equal to said decimation factor;
said fourth number is equal to twice said first number; and
said fifth number is equal to said length.

15. The method of claim 12 wherein:
said integrated circuit device is configured as a FIR filter that operates in an odd-symmetric decimation filter mode having a length and a decimation factor;
said method further comprises configuring a multiplexer between one of said data sample memories and one of said multipliers, whereby a zero input can be selected for said one of said multipliers;
each of said multipliers, except for said one of said multipliers, corresponds to two taps of said FIR filter, and said one of said multipliers corresponds to one tap of said FIR filter;
said first number is equal to one-half a quotient of said length and said decimation factor;
said second number is equal to said first number;
said third number is equal to said decimation factor;
said fourth number is equal to twice said first number; and
said fifth number is equal to said length.

16. A data storage medium encoded with machine-executable instructions for performing a method of programmably configuring an integrated circuit device as a FIR filter for operating in decimation filter mode, said integrated circuit device having a plurality of multipliers and at least one user-configurable block of random access memory, said method comprising:
programmably configuring a first number of multipliers to each correspond to one or more taps of said FIR filter, each of said multipliers having first and second multiplicand inputs;
programmably configuring a second number of coefficient memories from said at least one user-configurable block of random access memory, each respective one of said coefficient memories being connected to said first multiplicand input of a respective one of said multipliers, and having capacity to store a third number of coefficients;
programmably configuring a fourth number of data sample memories from said at least one user-configurable block of random access memory, each respective one of said data sample memories being connected to said second multiplicand input of a respective one of said multipliers, and having capacity to store a fifth number of data samples; and programmably configuring data read patterns for reading said data samples and said coefficients from said at least one user-configurable random access memory in an order corresponding to shifting of said data samples and said coefficients through said FIR filter.

17. The data storage medium of claim 16 wherein said instructions for said programmably configuring said FIR filter comprise instructions for programmably configuring said FIR filter such that:
- said integrated circuit device is configured as a FIR filter that operates in a non-symmetric decimation filter mode having a length and a decimation factor;
- each of said multipliers corresponds to one tap of said FIR filter;
- said first number is equal to a quotient of said length and said decimation factor;
- said second number is equal to said first number;
- said third number is equal to said length;
- said fourth number is equal to said first number; and
- said fifth number is equal to said decimation factor.

18. The data storage medium of claim 16 wherein said instructions for said programmably configuring said integrated circuit device as a FIR filter comprise instructions for programmably configuring said FIR filter such that:
- said integrated circuit device is configured as a FIR filter that operates in an even-symmetric decimation filter mode having a length and a decimation factor;
- each of said multipliers corresponds to two taps of said FIR filter;
- said first number is equal to one-half a quotient of said length and said decimation factor;
- said second number is equal to said first number;
- said third number is equal to said decimation factor;
- said fourth number is equal to twice said first number; and
- said fifth number is equal to said length.

19. The data storage medium of claim 16 wherein said instructions for said programmably configuring said integrated circuit device as a FIR filter comprise instructions for programmably configuring said FIR filter such that:
- said integrated circuit device is configured as a FIR filter that operates in an odd-symmetric decimation filter mode having a length and a decimation factor;
- said FIR filter further comprises a multiplexer between one of said data sample memories and one of said multipliers, whereby a zero input can be selected for said one of said multipliers;
- each of said multipliers, except for said one of said multipliers, corresponds to two taps of said FIR filter, and said one of said multipliers corresponds to one tap of said FIR filter;
- said first number is equal to one-half a quotient of said length and said decimation factor;
- said second number is equal to said first number;
- said third number is equal to said decimation factor;
- said fourth number is equal to twice said first number; and
- said fifth number is equal to said length.

\* \* \* \* \*